(12) United States Patent
Chang et al.

(10) Patent No.: US 12,181,525 B2
(45) Date of Patent: Dec. 31, 2024

(54) FIELD DETECTION DEVICE, SYSTEM AND METHOD FOR ACHIEVING NO MAINTENANCE OF GAS DENSITY RELAY

(71) Applicant: SHANGHAI ROYE ELECTRIC CO., LTD., Shanghai (CN)

(72) Inventors: Min Chang, Shanghai (CN); Haiyong Jin, Shanghai (CN); Zhengcao Guo, Shanghai (CN); Lele Wang, Shanghai (CN); Wei Zeng, Shanghai (CN); Haiming Liao, Shanghai (CN)

(73) Assignee: SHANGHAI ROYE ELECTRIC CO., LTD., Shanghai (CN)

( * ) Notice: Subject to any disclaimer, the term of this patent is extended or adjusted under 35 U.S.C. 154(b) by 361 days.

(21) Appl. No.: 17/640,784

(22) PCT Filed: Aug. 26, 2020

(86) PCT No.: PCT/CN2020/111248
§ 371 (c)(1),
(2) Date: Mar. 4, 2022

(87) PCT Pub. No.: WO2021/043036
PCT Pub. Date: Mar. 11, 2021

(65) Prior Publication Data
US 2022/0334184 A1    Oct. 20, 2022

(30) Foreign Application Priority Data

Sep. 4, 2019  (CN) .......................... 201910830158.4

(51) Int. Cl.
G01R 31/327  (2006.01)
G01N 9/00    (2006.01)
G05B 6/02    (2006.01)

(52) U.S. Cl.
CPC ........... *G01R 31/3278* (2013.01); *G01N 9/00* (2013.01); *G05B 6/02* (2013.01)

(58) Field of Classification Search
CPC ............ G01R 31/3271; G01R 31/3278; H01H 33/26; H01H 33/563; G05B 6/02; G05B 19/0423; G01N 9/00
See application file for complete search history.

(56) References Cited

U.S. PATENT DOCUMENTS

| | | | | |
|---|---|---|---|---|
| 3,749,865 | A * | 7/1973 | Kalt | H01H 35/24 200/83 C |
| 2008/0078237 | A1* | 4/2008 | Chambon | H01H 33/563 73/40 |
| 2021/0043402 | A1* | 2/2021 | Jin | G01L 7/048 |

FOREIGN PATENT DOCUMENTS

| | | |
|---|---|---|
| CN | 102841282 | 12/2012 |
| CN | 103245908 | 8/2013 |

(Continued)

*Primary Examiner* — Thang X Le
(74) *Attorney, Agent, or Firm* — Hsuanyeh Law Group, PC

(57) ABSTRACT

The invention discloses a field detection device and system for achieving no maintenance of a gas density relay. The field detection device comprises a temperature adjusting mechanism and an intelligent control unit, wherein rise and fall of the temperature of the temperature adjusting mechanism are controlled by the intelligent control unit, thereby making the temperature of a temperature compensation component of the density relay rise and fall to complete the field detection of the gas density relay, and no maintainer is needed to operate on site, which achieves no maintenance of the gas density relay, and greatly improves the efficiency and reliable and safe running of power grids. The invention further provides a field detection method for supporting normal running of the field detection device above.

19 Claims, 5 Drawing Sheets

(56) References Cited

FOREIGN PATENT DOCUMENTS

| | | | |
|---|---|---|---|
| CN | 104282485 | | 1/2015 |
| CN | 204270973 | * | 4/2015 |
| CN | 104698371 | * | 5/2015 |
| CN | 110411890 | | 11/2019 |
| CN | 110426312 | | 11/2019 |
| CN | 110487670 | | 11/2019 |
| CN | 211318085 | | 8/2020 |
| CN | 211426165 | | 9/2020 |
| DE | 2949976 | | 4/1981 |

* cited by examiner

FIELD DETECTION DEVICE, SYSTEM AND METHOD FOR ACHIEVING NO MAINTENANCE OF GAS DENSITY RELAY

CROSS-REFERENCE TO RELATED APPLICATIONS

The present application claims the priority of the Chinese patent application (name of invention: Field Detection Device, System and Method for Achieving No Maintenance of Gas Density Relay) applied on Sep. 4, 2019, with the application No.: 201910830158.4.

TECHNICAL FIELD

The invention relates to the technical field of electric power, in particular to a field detection device, system and method for achieving no maintenance of a gas density relay applied to a high-voltage electrical equipment.

BACKGROUND

A gas density relay is generally used to monitor and control the density of insulating gas in a high-voltage or medium-voltage electrical equipment, and a contact signal control loop is provided inside the gas density relay. A gas path of the gas density relay is in communication with an air chamber of the high-voltage or medium-voltage electrical equipment. When gas leakage is detected, a contact action of the gas density relay generates a contact signal, and the contact signal control loop alarms or locks according to the contact signal, so as to realize safe operation protection of the electrical equipment.

At present, SF6 (sulfur hexafluoride) electrical equipments have been widely used in electric power departments and industrial and mining enterprises, promoting the rapid development of the electric power industry. In recent years, with the rapid economic development, the capacity of China's electric power system has expanded rapidly, and the amount of SF6 electrical equipment is increasing. The SF6 gas plays the role of arc extinguishing and insulation in the high-voltage electrical equipment. If the SF6 gas density in the high-voltage electrical equipment decreases, and a moisture content exceeds the standard, the safe operation of the SF6 high-voltage electrical equipment may be seriously affected: 1) the decrease of the SF6 gas density to a certain extent may lead to the loss of insulation and arc extinguishing performance; 2) with the participation of some metals, the SF6 gas can hydrolyze with water at a temperature above 200° C. to generate active HF and SOF2, which corrodes insulating parts and metal parts, and generates a large amount of heat, which increases the pressure of the air chamber; and 3) when the temperature decreases, too much water may form condensation water, which significantly reduces the surface insulating strength of the insulating parts, even flashover, causing serious harm. Therefore, it is mandatory in the operation regulations of power grid that the density and water content of the SF6 gas must be regularly detected before the equipment is put into operation and in operation.

With the development of unattended substation towards networking and digitizing and increasing requirements for remote control and telemetry, on-line monitoring of the gas density and the moisture content of the SF6 electrical equipment has important practical significance. With the continuous development of intelligent power grid in China, an intelligent high-voltage electrical equipment, as an important component and key node of an intelligent substation, plays an important role in the safety of the intelligent power grid. At present, most of the high-voltage electrical equipment is the SF6 gas insulating equipment. If the gas density decreases (such as leakage, etc.), the electrical performance of the equipment may be seriously affected and cause serious hidden dangers to the safe operation. At present, it is very common to monitor a gas density value in SF6 high-voltage electrical equipment on line. The prior gas density monitoring systems (devices) are basically as follows: 1) use the remote transmission SF6 gas density relay to collect, upload the density, pressure and temperature to realize an online monitoring of the gas density; and 2) use a gas density transmitter to collect and upload the density, pressure and temperature to realize the online monitoring of the gas density. The SF6 gas density relay is the core and key component. However, due to the harsh operating environment of the high-voltage substation field, especially the strong electromagnetic interference, the remote transmission SF6 gas density relay in the gas density monitoring system (device) currently used is composed of mechanical density relay and electronic remote transmission part. In addition, the traditional mechanical density relay is still retained in the power grid system with the gas density transmitter. The mechanical density relay has one group, two groups or three groups of mechanical contacts. When the pressure reaches the state of alarm, locking or overpressure, the information is transmitted to the target equipment terminal by connecting a circuit through the contact in time to ensure the safe operation of the equipment. At the same time, the monitoring system is also equipped with a safe and reliable circuit transmission function to establish an effective platform for real-time data remote data reading and information monitoring and may timely transmit pressure, temperature, density and other information to a target equipment (such as an computer terminal) to realize online monitoring.

Regular inspection of the gas density relay on the SF6 electrical equipment is a necessary measure to prevent problems before they happen and ensure the safe and reliable operation of the SF6 electrical equipment. Both "Electric Power Preventive Test Regulations" and "Twenty-five Key Requirements for Preventing Major Accidents in Electric Power Production" require that the gas density relay be checked regularly. From an actual operation point of view, a regular check of the gas density relay is one of a necessary means to ensure the safe and reliable operation of an electric power equipment. Therefore, at present, the check of SF6 gas density relay has been paid much attention and popularized in the electric power system, and all power supply companies, power plants and large factories and mining enterprises have implemented it. However, power supply companies, power plants and large factories and mining enterprises need to equip testers, equipment vehicles and high-value SF6 gas to complete the field check and detection of the gas density relay. Roughly calculated, including a business loss due to power interruption during detection, the annual detection cost of each high-voltage switchyard is about tens of thousands to hundreds of thousands of yuan. In addition, there are still potential safety hazards if the test members do not operate in a standardized way. Therefore, it is very necessary to innovate on the prior gas density relay, so that the gas density relay or the monitoring system that realizes online monitoring of gas density also has the check function of gas density relay, so as to complete the regular check of the (mechanical) gas density relay without requiring a maintainer to go to a site, which greatly improves the efficiency and reduces the cost.

At the same time, an online self check gas density relay or the monitoring system composed thereof may accurately measure the moisture value inside the air chamber of the electrical equipment.

SUMMARY

The object of the invention is to provide a field detection device, system and method for achieving no maintenance of a gas density relay applied to a high-voltage electrical equipment, which is used to monitor the gas density of a gas-insulated or arc-extinguished electrical equipment, and at the same time, complete online check of the gas density relay, improve efficiency, reduce operation and maintenance cost and ensure safe operation of a power grid.

To achieve the above purpose, the invention uses the following technical solutions:

A first aspect of the application provides a field detection device for achieving no maintenance of a gas density relay.

A second aspect of the application provides a field detection system for achieving no maintenance of a gas density relay, the system is composed of the field detection device for achieving no maintenance of the gas density relay described in the first aspect, or includes the field detection device for achieving no maintenance of the gas density relay described in the first aspect.

The field detection device for achieving no maintenance of the gas density relay described in the application includes a temperature adjusting mechanism and an intelligent control unit; the temperature adjusting mechanism is a temperature adjustable adjusting mechanism, and is arranged outside or inside a housing of a detected gas density relay, and is configured to adjust the temperature rise and fall of a temperature compensation element of the gas density relay, so that the gas density relay makes a contact action; the intelligent control unit is connected with the temperature adjusting mechanism and used for receiving and/or calculating a gas density value when a contact of the gas density relay acts;

the temperature adjusting mechanism is a heating element; or the temperature adjusting mechanism includes a heating element, a heat insulation element, a temperature controller, a temperature detector, and a temperature adjusting mechanism outer shell; or the temperature adjusting mechanism includes a heating element and a temperature controller; or the temperature adjusting mechanism includes a heating element, a heating power regulator, and a temperature controller; or the temperature adjusting mechanism includes a heating element, a refrigeration element, a heating power regulator, and a temperature controller; or the temperature adjusting mechanism includes a heating element, a heating power regulator, and a thermostatic controller; or the temperature adjusting mechanism includes a heating element, a temperature controller, and a temperature detector; or the temperature adjusting mechanism is a heating element, and the heating element is provided near the temperature compensation element; or the temperature adjusting mechanism is a miniature constant temperature box;

where the number of the heating element is at least one, and the heating element includes, but is not limited to, one of a silicon rubber heater, a resistance wire, an electric heating tape, an electric heating rod, a hot gas fan, an infrared ray heating member and a semiconductor;

the temperature controller is connected to the heating element and used for controlling a heating temperature of the heating element, and the temperature controller includes, but is not limited to, one of a PID controller, a controller combining PID and fuzzy control, an inverter controller, and a PLC controller.

Preferably, a contact signal is generated during the contact action, and the contact signal preferably includes an alarm and/or locking.

Preferably, the field detection device further includes a housing, and the intelligent control unit and the temperature adjusting mechanism are arranged in the housing.

Preferably, the intelligent control unit automatically controls the whole check process, including all peripherals, logic, input and output, based on an embedded system built-in algorithm and control program of the microprocessor.

Preferably, the intelligent control unit automatically controls the whole check process, including all peripherals, logic, input and output, based on built-in algorithms and control programs such as a general purpose computer, an industrial control computer, an ARM chip, an AI chip, a CPU, a MCU, a FPGA, a PLC, an industrial control main board and an embedded master control board.

Preferably, circuits of the intelligent control unit include an intelligent control unit protection circuit, the intelligent control unit protection circuit includes one or more of an anti-static interference circuit (such as ESD and EMI), an anti-surge circuit, an electric quick protection circuit, an anti-RF field interference circuit, an anti-pulse group interference circuit, a power supply short-circuit protection circuit, a power supply reverse protection circuit, an electric contact misconnection protection circuit, and a charging protection circuit.

Preferably, the intelligent control unit further includes a communication module for achieving long distance transmission of test data and/or check results, where an communication mode of the communication module is wire communication or wireless communication.

More preferably, the wire communication mode includes one or more of RS232 bus, RS485 bus, CAN-BUS, 4-20 mA, Hart, IIC, SPI, Wire, coaxial cable, PLC power carrier, and cable.

More preferably, the wireless communication mode includes one or more of 5G/NB-IOT communication modules (such as 5G, NB-IOT), 2G/3G/4G/5G, WIFI, Bluetooth, Lora, Lorawan, Zigbee, infrared ray, ultrasonic wave, sound wave, satellite, optical wave, quantum communication, and sonar.

Preferably, the intelligent control unit is provided with an electric interface, the electric interface is used to store test data, and/or export the test data, and/or print the test data, and/or communicate data with a host, and/or input analog quantity or digital quantity information.

More preferably, the electric interface is provided with an electric interface protection circuit to prevent the interface from being damaged due to misconnection of users and/or to prevent electromagnetic interference.

Preferably, the intelligent control unit is further provided with a clock, the clock is used to regularly set the check time, record the test time or record the event time.

Preferably, after the field detection device completes the detection, the intelligent control unit automatically generates a check report of the gas density relay, and if there is any abnormality, the unit automatically gives an alarm, and/or uploads the report to a remote end and/or sends it to a specified receiver.

Preferably, the intelligent control unit includes a microprocessor, a human machine interface, a controller, a temperature adjusting mechanism detector, and an execution controller.

Preferably, the temperature adjusting mechanism adjusts rise and fall of temperature, and a change rate of the temperature is not more than 1° C. per second, and may be determined according to a specific project technology.

Preferably, the temperature adjusting mechanism adjusts rise and fall of temperature, and a change rate of the temperature is not more than 0.5° C. per second.

Preferably, the field detection device further includes an online check contact signal sampling unit, the online check contact signal sampling unit is provided with a sampling contact connected to the gas density relay and configured to sample a contact signal of a gas density relay; and the online check contact signal sampling unit is further connected to the intelligent control unit.

More preferably, the online check contact signal sampling unit is provided with at least one independent sampling contact and may automatically complete a check on at least one contact of the gas density relay at the same time, and continuously measures without replacing a contact or reselecting a contact; the contact includes, but is not limited to one of an alarm contact, an alarm contact+a locking contact, an alarm contact+a locking 1 contact+a locking 2 contact, and an alarm contact+a locking contact+an overpressure contact.

More preferably, the online check contact signal sampling unit has a test voltage of no less than 24V for the contact action value or its switching value of the detected gas density relay, that is, upon checking, a voltage of no less than 24V is applied between the corresponding terminals of the contact.

More preferably, the online check contact signal sampling unit and the intelligent control unit are arranged together.

Furthermore, the online check contact signal sampling unit and the intelligent control unit are sealed in a cavity or housing.

More preferably, the online check contact signal sampling unit includes a first connecting circuit and a second connecting circuit, the first connecting circuit connects the contact of the detected gas density relay to a contact signal control loop, and the second connecting circuit connects the contact of the detected gas density relay to the intelligent control unit;

wherein in a non-check state, the contact is a normally open density relay, the second connecting circuit is disconnected or isolated, and the first connecting circuit is closed; in a check state, the first connecting circuit is disconnected, and the second connecting circuit is connected, such that the contact of the gas density relay is connected to the intelligent control unit; or in a non-check state, the contact is a normally closed density relay, the second connecting circuit is disconnected or isolated, and the first connecting circuit is closed; in a check state, the contact signal control loop is closed, such that the contact of the gas density relay is disconnected from the contact signal control loop, and the second connecting circuit is connected, such that the contact of the gas density relay is connected to the intelligent control unit.

Furthermore, the first connecting circuit includes a first relay, and the second connecting circuit includes a second relay, the first relay is provided with at least one normally closed contact, and the second relay is provided with at least one normally open contact, and the normally closed contact and the normally open contact maintain opposite switching states; the normally closed contact is serially connected in the contact signal control loop, and the normally open contact is connected to the contact of the gas density relay; in a non-check state, the normally closed contact is closed, the normally open contact is disconnected, and the gas density relay monitors the output state of the contact in real time; in a check state, the normally closed contact is disconnected, the normally open contact is closed, and the contact of the gas density relay is connected with the intelligent control unit through the normally open contact.

Furthermore, the first relay and the second relay are two independent relays or the same relay.

More preferably, the online check contact signal sampling unit is electrically isolated from the contact of the detected gas density relay by photoelectric means.

Preferably, the field detection device further includes a gas density detection sensor, the gas density detection sensor is provided with an interface in communication with the gas density relay; and the gas density detection sensor is further connected to the intelligent control unit and transmits a collected pressure value and temperature value, and/or gas density value to the intelligent control unit.

More preferably, the intelligent control unit obtains a contact action or switching of the gas density relay, and the gas density value collected by the gas density detection sensor, and an online check on the gas density relay is completed; or, the intelligent control unit obtains the contact action or a signal of switching of the gas density relay, and the pressure value and temperature value collected by the gas density detection sensor that are converted to a pressure value corresponding to 20° C. according to the pressure-temperature characteristic of gas, i.e., a gas density value, such that an online check on the gas density relay is completed.

More preferably, the gas density detection sensor has an integrated structure.

Further, the gas density detection sensor is a gas density transmitter having an integrated structure.

More preferably, the gas density detection sensor comprises at least one pressure sensor and at least one temperature sensor, or the gas density detection sensor is a gas density transmitter composed of a pressure sensor and a temperature sensor; or the gas density detection sensor is a density detection sensor using a quartz tuning fork technology.

Further, the pressure sensor is mounted on a gas path of the gas density relay.

Further, the temperature sensor is mounted on or outside the gas path of the gas density relay, or is mounted in the gas density relay, or is mounted outside the gas density relay.

Further, the intelligent control unit compares an environmental temperature value with a temperature value collected by the temperature sensor, and completes the check of the temperature sensor.

Further, the gas density detection sensor includes at least two pressure sensors, and pressure values collected by each pressure sensor are compared to complete a mutual check of each pressure sensor.

Further, the gas density detection sensor includes at least two temperature sensors, and temperature values collected by each temperature sensor are compared to complete the mutual check of each temperature sensor.

Further, the gas density detection sensor includes at least one pressure sensor and at least one temperature sensor;

pressure values collected by each pressure sensor and temperature values collected by each temperature sensor are randomly arranged and combined, each combination is converted to a plurality of pressure values corresponding to 20° C. according to the pressure-temperature characteristic of gas, i.e., gas density values, and a comparison is made among each gas density value to complete a mutual check on each pressure sensor and each temperature sensor; or pressure values collected by each pressure sensor and temperature values collected by each temperature sensor traverse all arrangements and combinations, each combination is converted to a plurality of pressure values corresponding to 20° C. according to the pressure-temperature characteristic of gas, i.e., gas density values, and a comparison is made among each gas density value to complete a mutual check on each pressure sensor and each temperature sensor; or a plurality of gas density values obtained by each pressure sensor and each temperature sensor are compared with a compared density value output signal output by the gas density relay to complete a mutual check on each pressure sensor and each temperature sensor; or comparisons are made among a plurality of gas density values, pressure values, and temperature values obtained by each pressure sensor and each temperature sensor to complete mutual checks on the gas density relay, each pressure sensor, and each temperature sensor.

More preferably, the field detection device includes at least two gas density detection sensors, each of the gas density detection sensors includes a pressure sensor and a temperature sensor; comparisons are made among gas density values detected by each gas density detection sensor to complete mutual check of each gas density detection sensor.

More preferably, the field detection device includes a relative pressure sensor and/or an absolute pressure sensor.

Preferably, the field detection device further includes a valve, the valve is provided with a connection port in communication with the gas density relay; the valve is further connected to the intelligent control unit; the valve is configured to adjust gas pressure rise and fall of the gas density relay, or is used to set a gas initial pressure during a check, and then cooperate and/or combine with the temperature adjusting mechanism, to cause the contact action of the gas density relay.

More preferably, the valve is a valve with electrically motorized operation, and/or a solenoid valve.

Further, the valve is a permanent magnet solenoid valve.

More preferably, the valve is a piezoelectric valve, or a temperature-controlled valve, or a novel valve made of intelligent memory material and turned on or shut off by electric heating.

More preferably, the valve achieves being turned on or shut off in a manner of bending or clamping a hose.

More preferably, the valve is sealed inside a cavity or a housing.

More preferably, a pressure sensor is provided on each side of a gas path of the valve; or, a pressure or a density detector is provided on each side of the gas path of the valve.

Preferably, the field detection device further includes a pressure adjusting mechanism, where a gas path of the pressure adjusting mechanism is in communication with the gas density relay; the pressure adjusting mechanism is further connected to the intelligent control unit, regulates gas pressure rise and fall of the gas density relay under the control of the intelligent control unit, and then cooperates and/or combines with the temperature adjusting mechanism, to cause the contact action of the gas density relay; or further includes a heating member, where the intelligent control unit is connected to the heating member; or further includes an air chamber and a heating member, where the air chamber is in communication with the gas density relay, the heating member is provided outside or inside the air chamber, and the intelligent control unit is connected to the heating member.

More preferably, the pressure adjusting mechanism is manually adjusted or automatically adjusted. Preferably, the intelligent control unit is configured to achieve pressure control of the pressure adjusting mechanism.

More preferably, a pressure changing member of the pressure adjusting mechanism is a piston, where one end of the piston is connected to a adjusting rod, the outer end of the adjusting rod protrudes from the air chamber and is connected to a drive part, the other end of the piston is in sealed contact with the inner wall of the air chamber, and the drive part drives the adjusting rod which in turn moves the piston within the air chamber.

Further, the intelligent control unit controls the drive part to drive the adjusting rod which in turn moves the piston within the air chamber.

More preferably, a pressure changing member of the pressure adjusting mechanism is a piston, where the piston is in sealed contact with the inner wall of the air chamber, the outside of the air chamber is provided with a drive part, the drive part drives the adjusting rod to move the piston through electromagnetic force within the air chamber.

Further, the intelligent control unit controls the drive part to drive the piston through electromagnetic force to move within the air chamber.

More preferably, a pressure changing member of the pressure adjusting mechanism is an airbag, the reciprocating mechanism is a connecting tube for gas to enter and exit the airbag, and the drive part drives the airbag for pumping or inflating operation.

Further, the intelligent control unit controls the drive part to drive the airbag for pumping or inflating operation.

More preferably, a pressure changing member of the pressure adjusting mechanism is a bellow, where one end of the bellow communicates the gas density relay, and the other end of the bellow is driven by the drive part to expand and contract.

Further, the intelligent control unit controls the drive part to drive the bellow to expand and contract.

More preferably, a pressure changing member of the pressure adjusting mechanism is a deflation valve, where the deflation valve is a solenoid valve or a valve with electrically motorized operation, or another deflation valve achieved by electricity or gas.

Further, the intelligent control unit controls the operation of the deflation valve.

More preferably, the pressure adjusting mechanism further includes a flow valve for controlling the flow of gas release. Preferably, the intelligent control unit controls the operation of the flow valve.

More preferably, the pressure adjusting mechanism is a compressor. Preferably, the intelligent control unit controls the operation of the compressor.

More preferably, the pressure adjusting mechanism is a pump, where the pump includes, but is not limited to, a pressure pump, a booster pump, an electrical air pump, or an electromagnetic air pump. Preferably, the intelligent control unit controls the operation of the pump.

More preferably, the pressure adjusting mechanism is sealed inside a cavity a housing.

More preferably, the valve and the pressure adjusting mechanism are sealed inside a cavity a housing.

More preferably, the valve shuts off, the pressure adjusting mechanism ramps up and the load increases, or the pressure adjusting mechanism ramps down and the load decreases, the rate of change of the load being not more than 10%0 per second of the range of the detected gas density relay.

Preferably, the field detection device also includes a multichannel joint, where the temperature adjusting mechanism, and/or the intelligent control unit are provided on the multichannel joint.

More preferably, the field detection device further includes a micro-water sensor for monitoring online a gas micro-water value, where the micro-water sensor is provided on the multichannel joint, and the micro-water sensor is connected to the intelligent control unit.

Further, the field detection device further includes a gas circulation mechanism, where the gas circulation mechanism is provided on the multichannel joint, the gas circulation mechanism is connected to the intelligent control unit, and the gas circulation mechanism includes a capillary tube, a sealed chamber and a heating element, the gas flow is achieved by heating the heating element, and the micro-water value in the gas is monitored online.

Furthermore, the micro-water sensor may be mounted in the sealed chamber, in the capillary tube, at the capillary port, and outside the capillary tube of the gas circulation mechanism.

More preferably, the field detection device further includes a decomposition sensor for monitoring online gas decomposition, where the decomposition sensor is provided on the multichannel joint, and the decomposition sensor is connected to the intelligent control unit.

Preferably, the field detection device further includes a data display interface for man-machine interaction which can refresh current data value in real time; and/or support data input, such as inputting a parameter set value.

Preferably, the field detection device further includes a power source for supplying power to each power consuming device, where the power source includes a power supply circuit, or a battery, or a rechargeable battery, or solar energy, or a power source obtained by taking electricity from an instrument transformer, or an induction power source.

Preferably, the field detection device further includes a camera for monitoring.

Preferably, the field detection device may perform online gas supply.

Preferably, the field detection device may perform online gas drying.

Preferably, the field detection device has a self-diagnosis function, and may timely notify an abnormality.

Preferably, the field detection device has a security and protection function: when a gas density value, or a pressure value is below a set value, the check is automatically not performed, and a notice signal is sent out.

Preferably, the field detection device is also provided with a temperature protection device for an electronic component, which is used for ensuring that the electronic component can work reliably at a low or high ambient temperature.

Preferably, the temperature protection device includes a heater and/or a radiator, where the heater is turned on when the temperature is below a set value, and the radiator is turned on when the temperature is above a set value.

Preferably, the field detection device further includes an analytical train which detects, analyzes and judges the gas density value monitoring, the electrical performance of the gas density relay, and an monitoring element.

A third aspect of the application provides a method for achieving no maintenance of a gas density relay, the method including a field detection device, where the field detection device includes a temperature adjusting mechanism and an intelligent control unit, and the field detection device further includes an online check contact signal sampling unit, where the online check contact signal sampling unit is connected to the intelligent control unit, and the online check contact signal sampling unit is configured to, in a gas density relay check state, cut off a contact signal control loop of the gas density relay, connect a contact of the gas density relay to the intelligent control unit, sample a contact signal of the gas density relay, and transmit the contact signal to the intelligent control unit; and the field detection method including:

arranging the temperature adjusting mechanism of the field detection device together with the detected gas density relay; and connecting the intelligent control unit of the field detection device to the gas density relay;

monitoring, by the gas density relay in a normal operating state, a gas density value in an electrical equipment;

the field detection device, according to a set check time and/or check instruction, and a gas density value status and/or temperature value status, and under the condition that the gas density relay is allowed to and/or can be checked:

increasing the temperature of the gas density relay through the control of the intelligent control unit over the temperature adjusting mechanism, and then the temperature of a temperature compensation element of the gas density relay increasing, such that the gas density relay having a contact action, where the contact action is transmitted to the intelligent control unit through the online check contact signal sampling unit, and the intelligent control unit obtains a gas density value according to a pressure value and temperature value during the contact action, or directly obtains a gas density value, detects a contact signal action value of the gas density relay, and completes a check on the contact signal action value of the gas density relay;

turning off, by the intelligent control unit, a heating element of the temperature adjusting mechanism after all the check on the contact signal is completed.

Preferably, the field detection method for achieving no maintenance of a gas density relay further includes:

after the field detection device completes the check on the contact action value of the gas density relay, reducing the temperature of the gas density relay through the control of the intelligent control unit over the temperature adjusting mechanism, and then the temperature of the temperature compensation element of the gas density relay decreasing, such that the gas density relay having a contact reset, where the contact reset is transmitted to the intelligent control unit through the online check contact signal sampling unit, and the intelligent control unit obtains a gas density value according to a pressure value and temperature value during the contact reset, or directly obtains a gas density value, detects a contact signal return value of the gas density relay, and completes a check on the contact signal return value of the gas density relay.

Preferably, the field detection device further includes a valve and a pressure adjusting mechanism, where one end of the valve is provided with a connecting port in communication with an electrical equipment, the other end of the valve is in communication with a gas path of the gas density relay, a gas path of the pressure adjusting mechanism is in communication with the gas density relay, and the valve and the pressure adjusting mechanism are further connected to the intelligent control unit; and the field detection method for achieving no maintenance of a gas density relay further includes:

monitoring, by the gas density relay in a normal operating state, a gas density value in an electrical equipment;
the intelligent control unit or the gas density relay, according to the set check time and/or check instruction, and the gas density value status and/or temperature value status, and under the condition that the gas density relay is allowed to and/or can be checked:
closing the valve through the intelligent control unit;
driving the pressure adjusting mechanism through the intelligent control unit to make the gas pressure slowly decrease, and increasing the temperature of the gas density relay through the control of the intelligent control unit over the temperature adjusting mechanism, and then the temperature of the temperature compensation element of the gas density relay increasing, such that the gas density relay having a contact action, where the contact action is transmitted to the intelligent control unit through the online check contact signal sampling unit, and the intelligent control unit obtains a gas density value according to a pressure value and temperature value during the contact action, or directly obtains a gas density value, detects a contact signal action value of the gas density relay, and completes a check on the contact signal action value of the gas density relay;
opening the valve by the intelligent control unit, and turning off, by the intelligent control unit, the heating element of the temperature adjusting mechanism after all the check on the contact signal is completed.

Preferably, the field detection device further includes a valve and a pressure adjusting mechanism, where one end of the valve is provided with a connecting port in communication with an electrical equipment, the other end of the valve is in communication with a gas path of the gas density relay, a gas path of the pressure adjusting mechanism is in communication with the gas density relay, and the valve and the pressure adjusting mechanism are further connected to the intelligent control unit; and the field detection method for achieving no maintenance of a gas density relay further includes:

monitoring, by the gas density relay in a normal operating state, a gas density value in the electrical equipment, and monitoring online, by the gas density relay through a gas density detection sensor and the intelligent control unit, a gas density value in the electrical equipment;
the intelligent control unit or the gas density relay, according to the set check time and/or check instruction, and the gas density value status and/or temperature value status, and under the condition that the gas density relay is allowed to and/or can be checked:
closing the valve through the intelligent control unit;
adjusting the online check contact signal sampling unit to a check state through the intelligent control unit, wherein in the check state, the online check contact signal sampling unit cuts off a control loop of the contact signal of the gas density relay to connect the contact of the gas density relay to the intelligent control unit;
increasing the temperature of the gas density relay through the control of the intelligent control unit over the temperature adjusting mechanism, and then the temperature of the temperature compensation element of the gas density relay increasing, and driving the pressure adjusting mechanism through the intelligent control unit to make the gas pressure slowly decrease, such that the gas density relay having a contact action, where the contact action is transmitted to the intelligent control unit through the online check contact signal sampling unit, and the intelligent control unit obtains a gas density value according to a pressure value and temperature value during the contact action, or directly obtains a gas density value, detects a contact signal action value of the gas density relay, and completes a check on the contact signal action value of the gas density relay;
reducing the temperature of the gas density relay through the control of the intelligent control unit over the temperature adjusting mechanism, and then the temperature of a temperature compensation element of the gas density relay decreasing, and driving the pressure adjusting mechanism through the intelligent control unit to make the gas pressure slowly increase, such that the gas density relay having a contact reset, where the contact reset is transmitted to the intelligent control unit through the online check contact signal sampling unit, and the intelligent control unit obtains a gas density value according to a pressure value and temperature value during the contact reset, or directly obtains a gas density value, detects a contact signal return value of the gas density relay, and completes a check on the contact signal return value of the gas density relay;
opening the valve by the intelligent control unit, turning off, by the intelligent control unit, the heating element of the temperature adjusting mechanism, and adjusting, by the intelligent control unit, the online check contact signal sampling unit to an operating state, and the control loop of the contact signal of the gas density relay resuming a normal operating state, after all the check on the contact signal is completed.

Preferably, the field detection device further includes a valve, one end of the valve is provided with a connecting port in communication with an electrical equipment, the other end of the valve is in communication with a gas path of the gas density relay, the valve is further connected to the intelligent control unit; the field detection method for achieving no maintenance of a gas density relay further includes:

monitoring, by the gas density relay in a normal operating state, a gas density value in the electrical equipment, and monitoring online, by the gas density relay through a gas density detection sensor and the intelligent control unit, a gas density value in the electrical equipment;
the intelligent control unit or the gas density relay, according to the set check time and/or check instruction, and the gas density value status and/or temperature value status, and under the condition that the gas density relay is allowed to and/or can be checked:
adjusting the online check contact signal sampling unit to a check state through the intelligent control unit, where in the check state, the online check contact signal sampling unit cuts off a control loop of the contact signal of the gas density relay to connect the contact of the gas density relay to the intelligent control unit;
increasing the temperature of gas of the gas density relay through the control of the intelligent control unit over the temperature adjusting mechanism, and closing the valve through the intelligent control unit after the temperature reaching a set value;

after the temperature or pressure of the gas of the gas density relay decreases to a set value, increasing the temperature of the gas density relay through the control of the intelligent control unit over the temperature adjusting mechanism, and then the temperature of a temperature compensation element of the gas density relay increasing, such that the gas density relay having a contact action, where the contact action is transmitted to the intelligent control unit through the online check contact signal sampling unit, and the intelligent control unit obtains a gas density value according to a pressure value and temperature value during the contact action, or directly obtains a gas density value, detects a contact signal action value of the gas density relay, and completes a check on the contact signal action value of the gas density relay;

opening the valve by the intelligent control unit, and turning off, by the intelligent control unit, the temperature adjusting mechanism after all the check on the contact signal is completed.

Preferably, the field detection device further includes a heating member, an air chamber and a valve, where the air chamber is in communication with the gas density relay, the heating member is provided outside or inside the air chamber, one end of the valve is provided with a connecting port in communication with an electrical equipment, the other end of the valve is communicated with a gas path of the gas density relay; the valve is further connected to the intelligent control unit; and the field detection method for achieving no maintenance of a gas density relay further includes:

monitoring, by the gas density relay in a normal operating state, a gas density value in the electrical equipment, and monitoring online, by the gas density relay through a gas density detection sensor and the intelligent control unit, a gas density value in the electrical equipment;

the intelligent control unit or the gas density relay, according to the set check time and/or check instruction, and the gas density value status and/or temperature value status, and under the condition that the gas density relay is allowed to and/or can be checked:

adjusting the online check contact signal sampling unit to a check state through the intelligent control unit, where in the check state, the online check contact signal sampling unit cuts off a control loop of the contact signal of the gas density relay to connect the contact of the gas density relay to the intelligent control unit;

controlling the heating member to heat through the intelligent control unit to cause a change in the temperature of gas in the air chamber between the valve and the gas density relay, and after the temperature reaching a set value, closing the valve through the intelligent control unit and turning off the heating member through the intelligent control unit;

after the temperature of the air chamber decreases to a set value, increasing the temperature of the gas density relay through the control of the intelligent control unit over the temperature adjusting mechanism, and then the temperature of a temperature compensation element of the gas density relay increasing, such that the gas density relay having a contact action, where the contact action is transmitted to the intelligent control unit through the online check contact signal sampling unit, and the intelligent control unit obtains a gas density value according to a pressure value and temperature value during the contact action, or directly obtains a gas density value, detects a contact signal action value of the gas density relay, and completes a check on the contact signal action value of the gas density relay;

opening the valve by the intelligent control unit, and turning off, by the intelligent control unit, the temperature adjusting mechanism after all the check on the contact signal is completed.

Preferably, the field detection device further includes a heating member, an air chamber and a valve, where the air chamber is in communication with the gas density relay, the heating member is provided outside or inside the air chamber, one end of the valve is provided with a connecting port in communication with an electrical equipment, the other end of the valve is communicated with a gas path of the gas density relay; the valve is further connected to the intelligent control unit; and the field detection method for achieving no maintenance of a gas density relay further includes:

monitoring, by the gas density relay in a normal operating state, a gas density value in the electrical equipment, and monitoring online, by the gas density relay through a gas density detection sensor and the intelligent control unit, a gas density value in the electrical equipment;

the intelligent control unit or the gas density relay, according to the set check time and/or check instruction, and the gas density value status and/or temperature value status, and under the condition that the gas density relay is allowed to and/or can be checked:

adjusting the online check contact signal sampling unit to a check state through the intelligent control unit, where in the check state, the online check contact signal sampling unit cuts off a control loop of the contact signal of the gas density relay to connect the contact of the gas density relay to the intelligent control unit;

controlling the heating member to heat through the intelligent control unit to cause a change in the temperature of gas in the air chamber, and after the temperature reaching a set value, closing the valve through the intelligent control unit and turning off the heating member through the intelligent control unit;

after the temperature of the air chamber decreases to a set value, increasing the temperature of the gas density relay through the control of the intelligent control unit over the temperature adjusting mechanism, and then the temperature of a temperature compensation element of the gas density relay increasing, such that the gas density relay having a contact action, where the contact action is transmitted to the intelligent control unit through the online check contact signal sampling unit, and the intelligent control unit obtains a gas density value according to a pressure value and temperature value during the contact action, or directly obtains a gas density value, detects a contact signal action value of the gas density relay, and completes a check on the contact signal action value of the gas density relay;

opening the valve by the intelligent control unit, and turning off, by the intelligent control unit, the temperature adjusting mechanism after all the check on the contact signal is completed.

More preferably, the field detection method for achieving no maintenance of a gas density relay further includes:

after the check on the contact signal action value of the gas density relay is completed, reducing the temperature of the gas density relay through the control of the intelligent control unit over the temperature adjusting mechanism, and then the temperature of the temperature compensation element of the gas density relay decreasing, such that the gas density relay having a contact reset, where the contact reset is transmitted to the intelligent control unit through the online check contact signal sampling unit, and the intelligent control unit obtains a gas density value according to a pressure value and temperature value during the contact reset, or directly obtains a gas density value, detects a contact signal return value of the gas density relay, and completes a check on the contact signal return value of the gas density relay;

opening the valve by the intelligent control unit, turning off, by the intelligent control unit, the temperature adjusting mechanism, and adjusting, by the intelligent control unit, the online check contact signal sampling unit to an operating state, and the control loop of the contact signal of the gas density relay resuming a normal operating state, after all the check on the contact signal is completed.

Preferably, the contact signal includes an alarm and/or locking.

Preferably, after the check on the gas density relay is completed, if there is any abnormality, the field detection device may automatically give an alarm, and/or upload the alarm to a remote end, and/or send the alarm to a specified receiver.

Compared with the prior art, technical solutions in the invention have the following beneficial effects:

1) a field detection device and system for achieving no maintenance of a gas density relay are provided, and the field detection device includes a temperature adjusting mechanism and an intelligent control unit, the temperature of the gas density relay through the control of the intelligent control unit over the temperature adjusting mechanism rises or falls, and then the temperature of a temperature compensation element of the gas density relay rises or falls, so that the gas density relay has a contact action or reset, field detection (monitoring or checking) of the gas density relay is completed, and no maintainer is needed to operate on site, which achieves no maintenance of the gas density relay. The detection device is of compact and reasonable layout, and the connection and disassembly of each part is easy to operate, which improves the reliability of power grids, increases the efficiency, and reduces the cost.

2) a field detection method for achieving no maintenance of a gas density relay is provided, and the method can support the above field detection device to normally run.

BRIEF DESCRIPTION OF DRAWINGS

The drawings, which form a part of the application, are used to provide a further understanding of the application, and the illustrative embodiments and descriptions of the application are used to explain the application, and do not constitute undue restrictions on the application. In the drawings.

DETAILED DESCRIPTION OF THE EMBODIMENTS

Embodiment I

Figure 1:
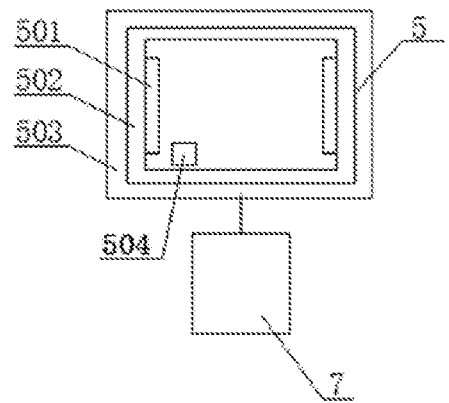
FIG. 1 is a structural schematic diagram of a field detection device of Embodiment I.

As shown in FIG. 1, a field detection device includes a temperature adjusting mechanism 5 and an intelligent control unit 7. For the temperature adjusting mechanism 5, the temperature adjusting mechanism is configured to adjust temperature rise and fall of a temperature compensation element of a gas density relay, so that the gas density relay has a contact action, generating a contact signal; the intelligent control unit 7 is connected to the temperature adjusting mechanism 5, and configured to achieve control over the temperature adjusting mechanism 5; where, the contact signal includes an alarm, and/or locking.

The temperature adjusting mechanism 5 of the embodiment mainly consists of a heating element 501, a heat insulation element 502, a controller 504, a temperature detector 3 (the same as a temperature sensor), and a temperature adjusting mechanism outer shell 503, etc. The controller 504 may use PID control, or use a control method of a combination of the PID control and fuzzy control. The electric heating operation power range of the heating element 501 is controlled by the controller 504 and a temperature rise and fall amplitude set value, and the temperature variation range is controlled by different power sizes. A deviation degree may be set to make it heat or cool in advance. When the temperature in the temperature adjusting mechanism 5, through the intelligent control unit 7 and the controller 504, in measuring the gas density relay contact signal action value, is close to the action value, the rate of change of the temperature is not more than 1.0° C. per second (or even not more than 0.5° C. per second, or the requirement is set as needed), that is, the temperature requirement rises or falls smoothly. Specifically, an approaching (or gradual) method may be used to make the temperature rise or fall smoothly, for example, heating may be stopped when a set range is reached, and after a while low power heating is performed, so that the rate of change of the temperature is not more than 1.0° C. per second when the temperature is close to the action value (even not more than 0.5° C. per second, or the requirement is set as needed), that is, the temperature requirement rises or falls smoothly.

The temperature adjusting mechanism 5 is a heating element; or, the temperature adjusting mechanism mainly consists of a heating element, a heat insulation element, a temperature controller, a temperature detector, a temperature adjusting mechanism shell, etc.; or the temperature adjusting mechanism mainly consists of a heating element and a temperature controller; or the temperature adjusting mechanism mainly consists of a heating element, a heating power regulator, and a temperature controller; or the temperature adjusting mechanism mainly consists of a heating element, a refrigeration element, a heating power regulator, and a temperature regulator; or the temperature adjusting mechanism mainly consists of a heating element, a heating power regulator, and a thermostatic controller; or the temperature adjusting mechanism mainly consists of a heating element, a temperature controller, a temperature detector, etc.; or the temperature adjusting mechanism is a heating element which is provided near a temperature compensation element; or the temperature adjusting mechanism is a miniature constant temperature box; the heating element includes, but is not limited to, one of a silicon rubber heater, a resistance wire, an electric heating tape, an electric heating rod, an hot gas fan, an infrared ray heating member, and a semiconductor; the heating element consists of a plurality of heating elements; the temperature controller includes, but is not limited to, one of a PID controller, a controller combining PID with fuzzy control, an inverter controller, and a PLC controller.

In a preferable embodiment, the field detection device further includes a shell (not shown in the figure), and the intelligent control unit 7 and the temperature adjusting mechanism 5 are provided inside the housing.

Embodiment II

Figure 2:
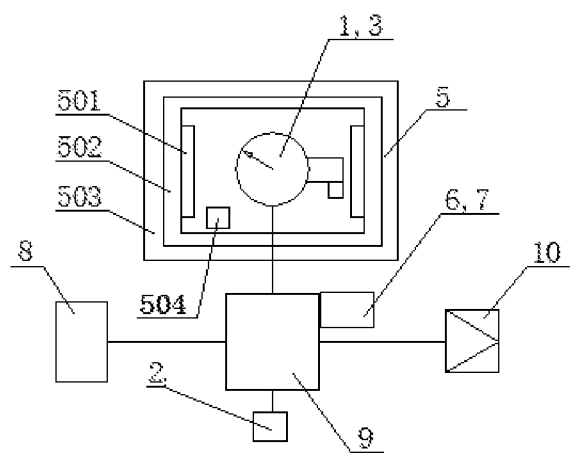
FIG. 2 is a structural schematic diagram of a field detection device of Embodiment II (operation state, connected to a gas density relay)

As shown in FIG. 2, a field detection device of the embodiment, compared with that of Embodiment I, is added with a pressure sensor 2, a temperature sensor 3, an online check contact signal sampling unit 6, a multichannel joint 9, and an air admission interface 10. The pressure sensor 2 and the air admission interface 10 are provided at the multichannel joint 9. A temperature adjusting mechanism 5 and a gas density relay 1 are provided in an opposite way, and the temperature sensor 3 is provided inside a housing of the density relay 1. The gas density relay 1 and the air admission interface 10 are provided at the multichannel joint 9, and the pressure sensor 2, the online check contact signal sampling unit 6, and an intelligent control unit 7 are provided at the multichannel joint 9. The temperature adjusting mechanism 5 is provided outside the density relay 1. Specifically, the gas density relay 1 communicates with electrical equipment 8 through the multichannel joint 9; the pressure sensor 2 communicates with the gas density relay 1 on a gas path through the multichannel joint 9; the online check contact signal sampling unit 6 is separately connected to the gas density relay 1 and the intelligent control unit 7; the pressure sensor 2, the temperature sensor 3, and the temperature adjusting mechanism 5 are separately connected to the intelligent control unit 7; and the air admission interface 10 communicates with the multichannel joint 9.

The temperature adjusting mechanism 5 is configured to adjust temperature rise and fall of the temperature of a temperature compensation element of the gas density relay 1 to enable the gas density relay 1 to have a contact action; the online check contact signal sampling unit 6, connected to the gas density relay 1, is configured to sample a contact signal of the gas density relay 1; where the contact signal includes an alarm and/or locking. The temperature adjusting mechanism 5 mainly consists of a heating element 501, a heat insulation element 502, a controller 504, the temperature detector 3 (the same as the temperature sensor), a temperature adjusting mechanism shell 503, etc. The controller 504 may use PID control, or use a control method of the combination of the PID and fuzzy control. The electric heating operation power range of the heating element 501 is controlled by the controller 504 and a temperature rise and fall amplitude set value, and the temperature variation range is controlled by different power sizes. A deviation degree may be set to make it heat or cool in advance. When the temperature in the temperature adjusting mechanism 5, through the intelligent control unit 7 and the controller 504, in measuring the gas density relay contact signal action value, is close to the action value, the rate of change of the temperature is not more than 1.0° C. per second (or even not more than 0.5° C. per second, or the requirement is set as needed), that is, the temperature requirement rises or falls smoothly.

The operating principle thereof is as follows:

Through the handling or control of the intelligent control unit 7 over the temperature adjusting mechanism 5, the temperature of the gas density relay 1 increases, and then the temperature of the temperature compensation element of the gas density relay increases, and when the temperature is close to the action value, the rate of change of the temperature is not more than 1.0° C. per second (even not more than 0.5° C. per second, or the requirement is set as needed), that is, the temperature requirement rises or falls smoothly. Until the gas density relay 1 has the contact action, the contact action is transmitted to the intelligent control unit 7 through the online check contact signal sampling unit 6, and the intelligent control unit 7 obtains a gas density value according to a pressure value and a temperature value during the contact action, or the gas density value is directly obtained, to detect the contact signal action value of the gas density relay to complete a check on the contact signal action value of the gas density relay. For example, for the gas density relay with a density relay value of 0.6/0.52/0.50 MPa (with a rated value of 0.6 MPa/alarm pressure value of 0.52 MPa/alarm pressure value of 0.50 MPa, relative pressure), when the ambient temperature is 5° C., the air pressure of an air chamber of the electrical equipment 8 is 0.5562 MPa (relative pressure), and at this time, an alarm contact thereof has an action when the pressure value remains unchanged in the check system, and the temperature increases to 29.5° C., and the intelligent control unit 7 may obtain an alarm contact action value of the gas density relay of 0.5317 MPa (relative pressure) according to a pressure value of 0.5562 MPa (relative pressure) and a temperature value of 29.5° C. when the contact has the action, and the intelligent control unit 7 may obtain an error of the alarm contact action value: 0.0117 MPa (0.5317 MPa−0.52 MPa=0.0117 MPa) to complete the check on the alarm contact action value of the density relay.

Through the handling or control of the intelligent control unit 7 over the temperature adjusting mechanism 5, the temperature of the gas density relay 1 decreases, and then the temperature of the temperature compensation element of the gas density relay 1 decreases, which enables the gas density relay to have a contact reset, and the contact reset is transmitted to the intelligent control unit 7 through the contact signal sampling unit 6, and the intelligent control unit 7 obtains a gas density value according to a pressure value as well as a temperature value of the contact reset, or a gas density value is directly obtained, to detect a contact signal return value of the gas density relay to complete a check on the contact signal return value of the gas density relay; for example, for the above gas density relay with a density relay value of 0.6/0.52/0.50 MPa (with a rated value of 0.6 MPa/alarm pressure value of 0.52 MPa/alarm pressure value of 0.50 MPa, relative pressure), when the ambient temperature is 5° C., the air pressure of the electrical equipment 8 is 0.5562 MPa (relative pressure), and also at this time, the alarm contact triggers a contact reset when the pressure value remains unchanged in the check system, and the temperature decreases to 24.8° C., and the intelligent control unit 7 may obtain an alarm contact return value of the gas density relay of 0.5435 MPa (relative pressure) according to a pressure value of 0.5562 MPa (relative pressure) and a temperature value of 24.8° C. when the contact resets, and the intelligent control unit 7 may obtain a switching error of the alarm contact: 0.0118 MPa (0.5435 MPa-0.5317 MPa=0.0118 MPa) so as to complete the check on the alarm contact action value of the density relay. The intelligent control unit 7 may determine the performance of the checked gas density relay (qualified or disqualified) according to the requirement and the results of the check (check data).

When all the check on the contact signal is completed, the heating element 501 of the temperature adjusting mechanism 5 is shut off manually or by means of the intelligent control unit 7.

The gas density relay 1 includes: a gas density relay compensated by bimetallic strips, a gas density relay compensated by gas, or a gas density relay with combined compensation of bimetallic strips and gas; a fully mechanical gas density relay, a digital gas density relay, and a gas density relay with a combination of machines and digits; a density relay with a display (a density relay with pointer display, digital display or liquid crystal display), and a density relay without any display (namely a density switch); a SF6 gas density relay, a SF6 mixed gas density relay, a N2 gas density relay, other gas density relays, etc.

The pressure sensor 2 includes: an absolute pressure sensor, a relative pressure sensor, or an absolute pressure sensor and a relative pressure sensor, the number of which may be several. The form of the pressure sensor may be a diffusion silicon pressure sensor, an MEMS pressure sensor, a chip-type pressure sensor, a coil induction pressure sensor (such as a Bourden tube pressure sensor with an inducting coil), and a resistance pressure sensor (such as a Bourden tube pressure sensor with a slide-wire resistance). The pressure sensor may be an analog quantity pressure sensor, or may also be a digital quantity pressure sensor. Pressure acquisition uses various pressure sensing elements such as a pressure sensor and a pressure transmitter, for example, the type of diffusion silicon, sapphire, piezoelectricity and a strain gage (the type of a resistance strain gage and a ceramic strain gage).

The temperature sensor 3 may be: a thermocouple, a thermistor, or a semiconductor type; may be a contact type and a non-contact type; may be a thermal resistance and a thermocouple; and may be a digital type and an analog type, such as DS18B20 and pt100. To sum up, various temperature sensing elements such as the temperature sensor and the temperature transmitter may be used for temperature acquisition.

The basic requirements or functions of the intelligent control unit 7 are: by means of the intelligent control unit 7, the control and signal acquisition over the temperature adjusting mechanism 5 is completed to achieve: being capable of detecting the pressure value and temperature value for the contact of the gas density relay 1 having an action, and after the conversion to a pressure value P20 (the density value) corresponding to 20° C., the contact action value PD20 of the gas density relay 1 is detected so as to complete the check on the gas density relay 1; or being capable of directly detecting the density value PD20 for the contact of the gas density relay 1 having the action to complete the check on the gas density relay 1.

Of course, the intelligent control unit 7 may further achieve: a storage of test data; and/or an export of test data; and/or printing of test data; and/or data communication with a host; and/or input of information of the analog and digital quantities. The intelligent control unit 7 further includes a communication module through which remote transmission of information such as the test data and/or the results of the check is achieved; when the rated pressure value of the gas density relay 1 outputs signal, the intelligent control unit 7 simultaneously collect the density value of that time to complete the check on the rated pressure value of the gas density relay 1. Meanwhile, the self check among the gas density relay 1, pressure sensor 2, and the temperature sensor 3 is completed by means of the test on the rated pressure of the gas density relay 1 to achieve no maintenance.

The electrical equipment includes an SF6 gas electrical equipment, an SF6 mixed gas electrical equipment, an environmentally friendly gas electrical equipment, or another insulating gas electrical equipment.

Embodiment III

Figure 3:
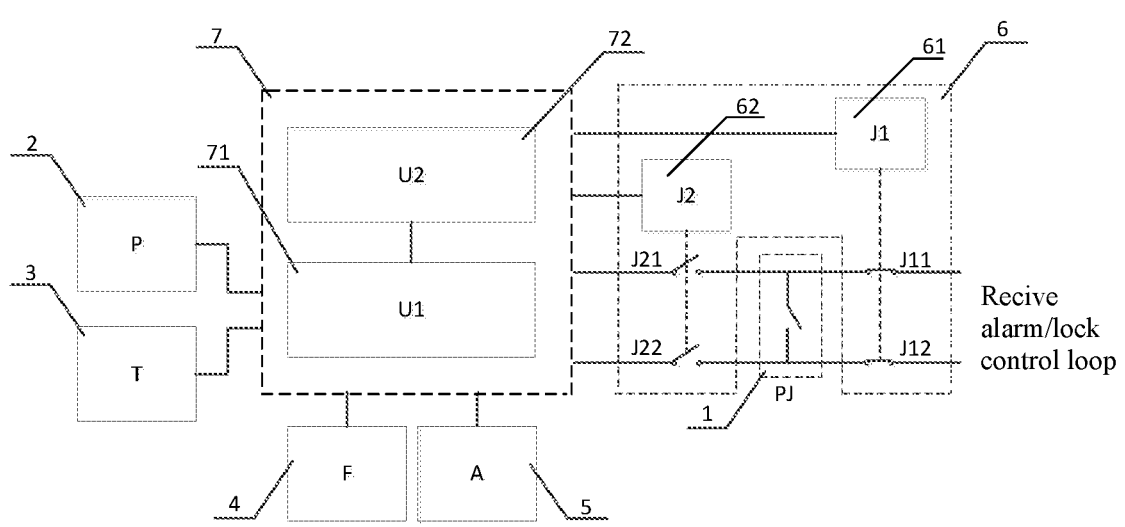
FIG. 3 is a schematic diagram of a control circuit of a field detection device of Embodiment III (operation state)

FIG. 3 is a schematic diagram of a control circuit of a field detection device.

The online check contact signal sampling unit 6 is mainly configured to complete the sampling of a contact signal of a gas density relay 1. That is, the basic requirements or functions of the online check contact signal sampling unit 6 are: 1) the safe running of an electrical equipment is not influenced when the check is performed, that is, when the check is performed and when the contact of a gas density relay 1 has an action, the safe running of the electrical equipment is not influenced; 2) the contact signal control loop of the gas density relay 1 does not influence the performance of the field detection device, especially does not influence the performance of an intelligent control unit 7 and does not cause any damage to the field detection device or influence the test.

As shown in FIG. 3, the online check contact signal sampling unit 6 of the embodiment consists of a relay J1 (61) and a relay J2 (62). When the pressure value is normal, the contact is a normally open contact gas density relay, where the two pairs of normally closed contacts J11 and J12 of the relay J1 (61) are connected in the contact signal control loop of the gas density relay 1 in series; and the two pairs of normally open contacts J21 and J22 of the relay J2 (62) are connected with the contact of the gas density relay 1. It can also be that: a pair of normally closed contacts J11 of the relay J1 (61) is connected in the contact signal control loop of the gas density relay 1 in series; and a pair of normally open contacts J21 of the relay J2 (62) is connected with the contact of the gas density relay 1; it can further be that the relay J1 (61) and relay J2 (62) are combined to be one relay with normally open and closed contacts. To sum up, the relay J1 (61) and J2 (62) may be used in a plurality of pairs, in a single pair, or in a flexible combination. Referring to FIG. 3, the intelligent control unit 7 consists of a processor U1 (71) and a power supply U2 (72), and the processor U1 (71) may be: a general-purpose computer, an industrial control computer, a CPU, a single chip microcomputer, an ARM chip, an AI chip, a quantum chip, a photonic chip, an MCU, an FPGA, a PLC, an industrial control main board, an embedded master control board, and another intelligent integrated circuit. The power supply U2 (72) may be: a switching power supply, an alternating current of 220 V, a direct current, an LDO, a programmable power supply, solar energy, a storage battery, a rechargeable battery, a cell, etc. The pressure sensor 2 of pressure acquisition P may be:

various pressure sensing elements such as a pressure sensor and a pressure transmitter. The temperature sensor 3 of temperature acquisition T may be: various temperature sensing elements such as a temperature sensor and a temperature transmitter. A valve (F) 4 may be: a gas path which can be opened and closed, such as a solenoid valve, a valve with electrically motorized operation, a pneumatically operated valve, a ball valve, a needle valve, a control valve, a stop valve, etc., and even an element which can control a flow rate. The valve may be a half automatic valve or a manually open valve. The pressure adjusting mechanism (A) 5 may be: an electrically regulated piston, a electrically regulated cylinder, a booster pump, air bottle compression, a valve, a solenoid valve, flow controller, etc. The temperature adjusting mechanism 5 may be half automatic, or may be manually adjusted.

The operating principle of the embodiment is as follows:

The intelligent control unit 7 of the field detection device detects the gas pressure P and the temperature T according to the pressure sensor 2 and the temperature sensor 3 and obtains the pressure value P20 (namely the gas density value) corresponding 20° C. according to the characters of the gas pressure-temperature. For example, for the SF6 gas, the Beattie-Bridgeman equation may be used for calculation; for the SF6 mixed gas, the calculation may be made according to Dalton's law of partial pressure, the Beattie-Bridgeman equation, and the ideal gas state equation.

When the gas density relay 1 requires a check, in the event of the gas density value P20≥the set safely checking density value Ps, the field detection device may send an instruction.

The intelligent control unit 7 controls the disconnection of the contact signal control loop of the gas density relay 1, that is, the contacts J11 and J12 of the electromagnetic relay J1 of the online check contact signal sampling unit 6 are disconnected so that the safe running of the electrical equipment may not be influenced when the gas density relay 1 is checked online, and that a false alarm signal may not be sent, or the control loop may not lock when a check is performed. Because before the field detection device starts the check, monitoring and determination have been performed on the gas density value P20≥the set safely checked density value PS, the gas of the electrical equipment is within the range of the safe running, and because the leakage of gas is a slow process, the gas is safe when the check is performed. At the same time, the field detection device causes closing to the contacts J21 and J22 of the electromagnetic relay J2 of the online check contact signal sampling unit 6 by means of the control of the intelligent control unit 7, and at this time, the contact PJ of gas density relay 1 is connected to the intelligent 7 by means of the contacts J21 and J22 of the electromagnetic relay J2.

Then, the intelligent control unit 7 controls the temperature adjusting mechanism 5, and the temperature of the temperature compensation element of the gas density relay 1 gradually increases to enable the gas density relay 1 to have a contact action which is uploaded to the intelligent control unit 7 by means of the electromagnetic relay J2 of the online check contact signal sampling unit 6, and the intelligent control unit 7 converts, according to the characteristic of gas, the pressure value P and the temperature value T obtained during the contact action to the pressure value P20 (gas density value) corresponding to 20° C. so as to detect the contact action value PD20 of the gas density relay 1, and after all of the contact action values of the alarm and/or blocking signal of the gas density relay 1 are detected, the temperature adjusting mechanism 5 is controlled and regulated by means of the intelligent control unit 7 to enable the temperature of the temperature compensation element of the gas density relay 1 to gradually decrease, thereby testing the contact return value of the alarm and/or locking of the gas density relay 1. The field detection device may perform the check in this manner for several times (for example twice to three times), and then calculate an average value so as to complete the check on the gas density relay 1.

After the check is completed, the intelligent control unit 7 controls the contacts J21 and J22 of the electromagnetic relay J2 of the online check contact signal sampling unit 6 to close, and at this time, the contact PJ of gas density relay 1 is no longer connected to the intelligent control unit 7. Meanwhile, the intelligent control unit 7 controls the valve 4 to open, to enable the gas density relay 1 to communicate with the electrical equipment on the gas path. The intelligent control unit 7 controls the contacts J11 and J12 of the electromagnetic relay J1 of the online check contact signal sampling unit 6 to close, and the density monitoring loop of the gas density relay 1 normally runs to enable the gas density relay 1 to safely monitor the gas density of the electrical equipment, thereby achieving safe and reliable operation of the electrical equipment. In this way, the online check on the gas density relay 1 is conveniently completed, and meanwhile, the safe running of the electrical equipment is not influenced when the gas density relay 1 is checked online.

After the check on the gas density relay 1 is completed, the field detection device may perform determination, so as to display the results of the detection in a flexible manner. Specifically, the manner includes: 1) the field detection device displaying the results on the spot, for example, by means of indicator lamps, digital or liquid crystal displaying, etc.; 2) or using online remote transmission communication to upload, for example, uploading the results to a remote back-end detection system; 3) or using wireless uploading to upload the results to a certain terminal, for example, using wireless uploading to upload the results to a cell phone; 4) or using other methods to upload; 5) or uploading the abnormal results through an alarm signal line or a special signal line; 6) uploading in a separate manner, or uploading bundled with other signals. To sum up, after the field detection device completes the online check on the gas density relay 1, if there is an abnormality, an alarm can be automatically sent, and the abnormality may be uploaded to a far end or sent to a designated receiver, for example, a cell phone. Or after the field detection device completes the online check on the gas density relay 1, if there is an abnormality, the intelligent control unit 7 may upload an alarm contact signal of the gas density relay 1 to a far end (a supervision chamber, a back-end supervision platform, etc.), and may display the results on the spot. A simple version of online check on the gas density relay may upload the abnormal check results through the alarm signal line according to a certain regularity, for example, in case of an abnormality, a contact is connected in parallel to the alarm signal contact to regularly close and disconnect, so that the condition may be obtained through parsing; or may upload through a separate checking signal line. Specifically, being in a good state may be uploaded, or a problem existing may be uploaded, or the checking results are uploaded through the separate check signal line or are displayed on the spot, alarmed on the spot, or uploaded through wireless, and uploaded by means of networking with a smart phone. The communication mode is wire or wireless communication, and the wire communication mode may be an industrial control bus such as RS232, RS485, and CAN-BUS, optical fiber Ethernet, 4-20 mA, Hart, IIC, SPI, Wire, a coaxial cable, a PLC power carrier, etc; the wireless communication mode may be 2G/3G/4G/5G, etc., WIFI, Bluetooth, Lora, Lorawan, Zigbee, infrared ray, ultrasonic wave, sound wave, satellite, optical wave, quantum communication, sonar, sensor built-in 5G NB-IOT communication module (such as NB-IOT), etc. To sum up, the reliability of the field detection device may be fully ensured in various modes and various combinations.

The field detection device has a safety protection function, and specifically, when the gas density value is below a set value, the field detection device automatically no longer performs online check and a notification signal is sent. For example, when the gas density value of the equipment is less than the set value PS, the check is stopped; and only when the gas density value of the device is ≥(the alarm pressure value +0.02 MPa) may the online check be performed.

The gas density relay may perform online check either according to a set time or a set temperature (for example, a limit high temperature, a high temperature, a limit low temperature, a low temperature, a normal temperature, a 20 degree, etc.). When the online check is performed at a high temperature, a low temperature, a normal temperature, and an ambient temperature of 20° C., an error determination requirement thereof is different. For example, when the online check is performed at the ambient temperature of 20° C., the required precision of the field detection device may be 1.0 level, or 1.6 level, and 2.5 level at a high temperature. The field detection may be implemented according to the requirements of the temperature and related standards. For example, the field detection may be implemented in accordance with the required precision corresponding to each temperature value in the temperature compensation performance regulations in DL/T 259, Article 4.8 of the Calibration Regulation for SF6 Gas Density Monitor.

The field detection device may compare the error performance thereof at different temperatures and different time periods. That is, the comparison having the comparison of various historical periods, history and present, performed in different periods and within the same temperature range may determine the performance of the gas density relay, the electrical equipment and the field detection device.

The gas density relay may be repeatedly checked for a plurality of times (for example, 2 to 3 times), and the average value of the gas density relay is calculated according to the check results of each time. The online check may be performed on the gas density relay 1 at any time when necessary.

The field detection device has the functions of pressure and temperature measurement and software conversion. On the premise that the safety running of the electrical equipment is not influenced, an alarm and/or locking contact value and/or return value of the gas density relay may be detected online. Of course, the alarm and/or locking return value may also not be tested as required.

The field detection device may automatically perform comparison and determination in the online check, and if the error is large, an abnormal prompt may be sent: there is something wrong with the gas density relay or the pressure sensor, the temperature sensor, etc, that is, the mutual functions of the gas density relay and the pressure sensor, the temperature sensor or the density transmitter may be completed by the field detection device, and the mutual check of the gas density relay, the pressure sensor and the temperature sensor may be completed. After the field detection device completes the check, a check report may be automatically generated, if there is any abnormality, an alarm may be automatically sent or sent to a designated receiver, for example, to a mobile phone. The field detection device may display the gas density value and the check results on the spot or through a back end, and the specific manner is flexible; have the functions of real-time online data display of the gas density value, the pressure value, the temperature value, etc., an analysis of a changing trend, an inquiry of historical data, a real-time alarm, etc; perform online monitoring on the gas density value, or the pressure value and the temperature value; have the self-diagnosis function to notice the abnormality in time, such as disconnection, short-circuit alarm, sensor damage, etc; and compare the error performance of the gas density relay at different temperatures and different time periods, that is, realize the comparison in different periods and within the same temperature range to determine the performance of the gas density relay; realize the comparison of various historical periods, history and present; furthermore, perform the self check on the field detection device; and determine whether the density value of the gas density relay and the monitored electrical equipment is normal or not. That is, the density value, the gas density relay, the pressure sensor, the temperature sensor, etc, of the electrical equipment may be determined, analyzed and compared normally or abnormally, such that the gas density monitoring of the electrical equipment, the determination, the comparison and the analysis of the state of the field detection device and the gas density relay are realized; and an analysis system (expert management and analysis system) is further contained for monitoring the gas density and detecting, analyzing and determining the state of the gas density relay and a monitoring element, so as to know where the problem lies, whether lies in the electrical equipment, the gas density relay or the field detection device itself; and also monitor the contact signal status of the gas density relay and transmits the status thereof remotely. The contact signal state of the gas density relay may be known to be open or closed at the background, so that a plurality of additional layers are provided, and the reliability is improved; the temperature compensation performance of the gas density relay may be checked, or detected and determined; the contact resistance of the contact point of the gas density relay may be checked, or detected and determined; and functions of data analysis and data processing are realized, so as to perform corresponding fault diagnosis and prediction on the electrical equipment.

As long as the detection data of the pressure sensor 2, the temperature sensor 3 and the gas density relay 1 are matched and normal, the field detection device and the gas density relay can be indicated to be normal, so that there is no need to check the gas density relay or the field detection device, achieving no check throughout the whole life. Unless the pressure sensor 2, the temperature sensor 3 and the gas density relay 1 of a certain electrical equipment in a substation are not matched and abnormal, maintainers are arranged for handling. For the matched and normal operation, there is no need for a check, which may greatly improve the reliability and efficiency and reduce the cost.

Embodiment IV

Figure 4:
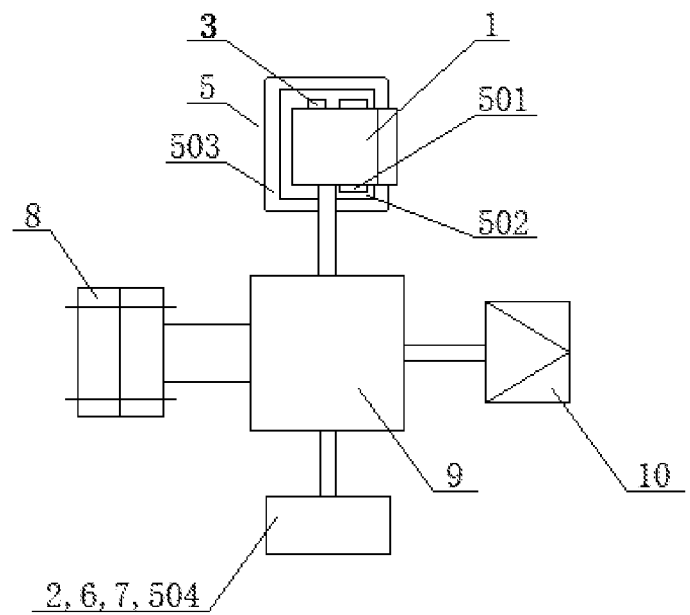
FIG. 4 is a structural schematic diagram of a field detection device of Embodiment IV (operation state, connected to a gas density relay)

As shown in FIG. 4, the field detection device of the present embodiment differs from the second embodiment in that: the temperature sensor 3 is provided on the housing of the density relay 1, and the temperature adjustment mechanism 5 is also provided on the housing of the density relay 1. The pressure sensor 2, the online check contact signal sampling unit 6, the intelligent control unit 7 and the controller 504 are arranged together on the multi-way joint 9. The gas density relay 1 is also provided on the multi-way joint 9. The pressure sensor 2, the online check contact signal sampling unit 6, and the controller 504 are connected to the intelligent control unit 7. The temperature adjusting mechanism 5 mainly consists of the heating element 501, the heat insulation element 502 and the controller 504.

Embodiment V

Figure 5:
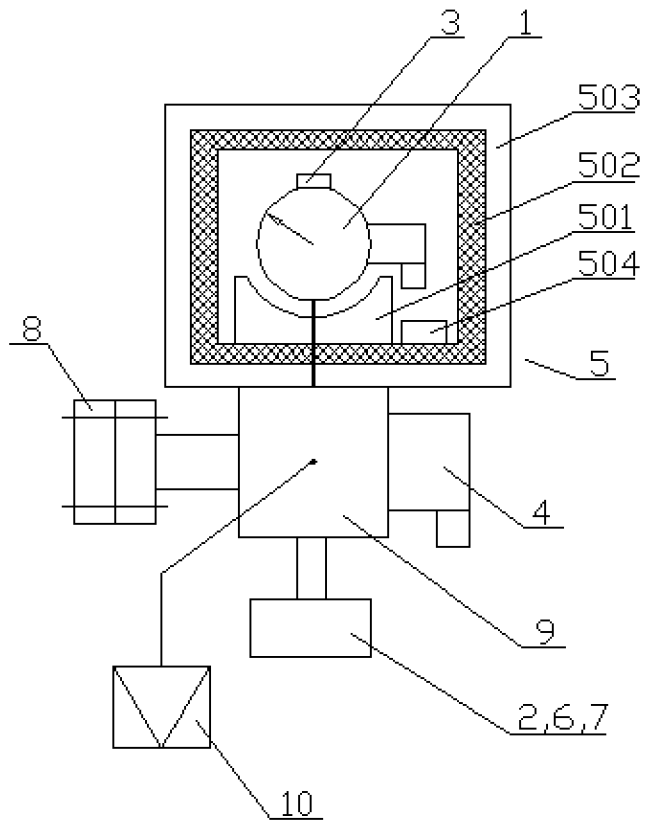
FIG. 5 is a structural schematic diagram of a field detection device of Embodiment V.

As shown in FIG. 5, the field detection device of the present embodiment includes: the pressure sensor 2, the temperature sensor 3, the valve 4, the temperature adjusting mechanism 5, the online check contact signal sampling unit 6, the intelligent control unit 7, the multi-way joint 9, and the gas supplementing interface 10. The temperature adjusting mechanism 5 mainly consists of the heating element 501, the heat insulation element 502 and the controller 504. The temperature adjusting mechanism 3 is provided on the density relay 1. The gas density relay 1 is provided inside the temperature adjusting mechanism 5. The pressure sensor 2, the online check contact signal sampling unit 6 and the intelligent control unit 7 are arranged together. The temperature adjusting mechanism 5 is mounted on the multi-channel joint 9; the pressure sensor 2 and the temperature sensor 3 are connected to the intelligent control unit 7; and the temperature adjusting mechanism 5 is connected to the intelligent control unit 7. During detection, the gas density relay 1 is mounted on the multi-way joint 9 of the field detection device, and the gas circuit is in communication with the pressure sensor 2.

Embodiment VI

Figure 6:
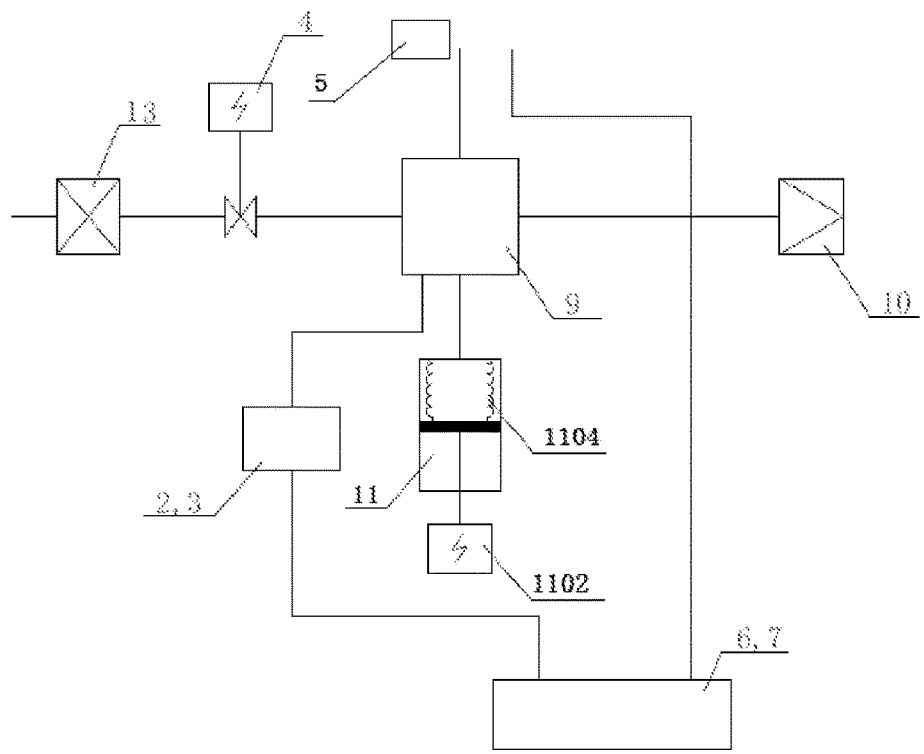
FIG. 6 is a structural schematic diagram of a field detection device of Embodiment VI.

As shown in FIG. 6, the field detection device of the embodiment includes: the pressure sensor 2, the temperature sensor 3, the valve 4, the temperature adjusting mechanism 5, the online check contact signal sampling unit 6, the intelligent control unit 7, the multi-way joint 9, the gas supplementing interface 10, a pressure adjusting mechanism 11, and a self-sealing valve 13. One end of the self-sealing valve 13 is connected to the electrical equipment in a sealing mode, and the other end of the self-sealing valve 13 is communicated with one end of the valve 4; and the other end of the valve 4 is connected to the multi-way joint 9. The pressure sensor 2 and the temperature sensor 3 are arranged together and connected to the multi-way joint 9, and may be combined to be a gas density transmitter, and the density value, the pressure value and the temperature value of the gas are directly obtained; the temperature adjusting mechanism 5 may be connected to the multi-way joint 9; and the online check contact signal sampling unit 6 and the intelligent control unit 7 are arranged together. The pressure sensor 2 and the temperature sensor 3 are directly or indirectly connected to the intelligent control unit 7; the valve 4 is connected to the intelligent control unit 7; the temperature adjusting mechanism 5 and the pressure adjusting mechanism 11 are connected to the intelligent control unit 7.

The pressure adjusting mechanism 11 of the present embodiment is communicated with the multi-way joint 9, and the pressure adjusting mechanism 11 mainly consists of a corrugated tube 1104 and a drive component 1102. One end of the corrugated tube 1104 is communicated with the multi-way joint 9, and the other end of the same stretches and retracts under the driving of the drive component 1102.

During detection, the gas density relay is installed on the multi-way joint 9 of the field detection device, so that the interior of the corrugated tube 1104 is connected with the gas density relay in a sealing mode, so as to form a reliable sealed cavity. The valve 4 is closed, and then the pressure adjusting mechanism 11, based on the control of the intelligent control unit 7, makes the drive part 1102 push the corrugated tube 1104 to change the volume thereof, and the sealed cavity changes its volume accordingly, thus completing the pressure rise and fall. Then the temperature of the gas density relay 1 is increased through the control of the intelligent control unit 7 over the temperature adjusting mechanism 5, and then the temperature of the temperature compensation element of the gas density relay 1 increases, and drives the pressure adjusting mechanism 11 through the intelligent control unit 7 to make the gas pressure slowly decrease, such that the gas density relay 1 hays a contact action, where the contact action is transmitted to the intelligent control unit 7 through the online check contact signal sampling unit 6, and the intelligent control unit 7 obtains a gas density value according to a pressure value and temperature value during the contact action, or directly obtains a gas density value, detects a contact signal action value of the gas density relay 1, and completes a check on the contact signal action value of the gas density relay.

Further, the intelligent control unit 7 or the gas density relay 1, according to the set check time and/or the check instruction, as well as the gas density value and/or temperature value, closes the valve through the intelligent control unit under the condition that the gas density relay is allowed and/or can be checked; drives the pressure adjusting mechanism through the intelligent control unit to make the gas pressure slowly decrease, and increases the temperature of the gas density relay through the control of the intelligent control unit over the temperature adjusting mechanism, and then the temperature of the temperature compensation element of the gas density relay increases, such that the gas density relay has a contact action, where the contact action is transmitted to the intelligent control unit through the online check contact signal sampling unit, and the intelligent control unit obtains a gas density value according to a pressure value and temperature value during the contact action, or directly obtains a gas density value, detects a contact signal action value of the gas density relay, and completes a check on the contact signal action value of the gas density relay.

The valve 4 may be controlled by various transmission modes, such as manual drive, electric drive, hydraulic drive, pneumatic drive, turbine drive, electromagnetic-hydraulic drive, electro-hydraulic drive, gas-hydraulic drive, spur gear drive and bevel gear drive, etc; under the action of pressure, temperature or other forms of sensing signals, the valve may act according to a preset requirement or simply open or close without relying on sensing signals. The valve relies on drive or automatic mechanism to make the opening and closing parts move up and down, slide, swing or rotate, thus changing the size of flow passage area thereof to realize control function of the same. The valve 4 may be driven by an automatic valve, a power-driven valve and a manual valve. The automatic valve may include: electromagnetic drive, electromagnetic-hydraulic drive, electro-hydraulic drive, turbine drive, spur gear drive, bevel gear drive, pneumatic drive, hydraulic drive, gas-hydraulic drive, electric drive, motor drive. The valve may be automatic or manual, semi-automatic. The check process may be automatically completed or semi-automatically completed through manual cooperation. The valve is directly or indirectly, integrally or separately with the electrical equipment through the self-sealing valve, the manual valve, or a non-removable valve. The valve may be normally opened or normally closed, unidirectional or bidirectional, as desired. To sum up, the gas path is opened or closed through an electrically operated valve. The electrically operated valve may be an electromagnetically operated valve, an electric controlled ball valve, an electric valve, an electrically controlled proportional valve etc. In addition, for the SF6 gas, a specific conversion method of pressure-temperature characteristics of the SF6 gas may be calculated according to Beattie-Bridgeman equation; for SF6 gas mixture, the specific conversion method of pressure-temperature characteristics of SF6 gas mixture may be calculated according to Dalton's law of partial pressure, Beattie-Bridgeman equation and Ideal gas equation of state. The temperature adjusting mechanism is provided inside, outside or on the housing of the gas density relay. The communication equipment is provided inside or outside the housing of the gas density relay, or is provided inside or outside the housing of the circuit control part, and may be provided flexibly as needed. The temperature sensor may be a digital type or an analog type. The signal generator includes, but is not limited to, a sensitive switch, a magnetic-assisted electric contact, a reed switch, and a miniature switch. The gas density relay body outputs the contact signal through the signal generator. The pressure detector includes, but is not limited to, the barbon tube, the corrugated tube, the corrugated tube+a spring and a pressure sensor; the temperature compensation element includes, but is not limited to, a temperature compensation sheet, a gas enclosed in the housing, and a temperature compensation sheet+a gas enclosed in the housing.

Embodiment VII

Figure 7:
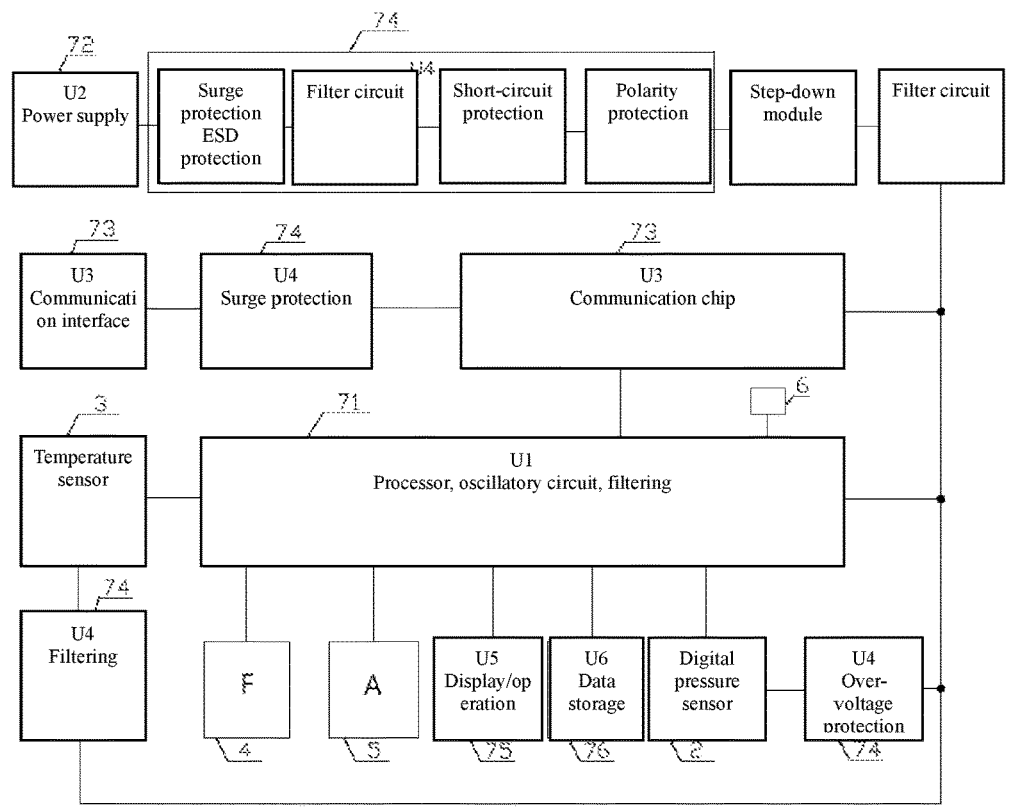
FIG. 7 is a schematic diagram of a control circuit of a field detection device of Embodiment VII.

As shown in FIG. 7, the field detection device of the embodiment includes: the pressure sensor 2, the temperature sensor 3, the valve 4, the temperature adjusting mechanism 5, the online check contact signal sampling unit 6, and the intelligent control unit 7. The pressure sensor 2, the temperature sensor 3, the valve 4, the temperature adjusting mechanism 5 and the online check contact signal sampling unit 6 are both connected to a processor 71 (U1) of the intelligent control unit 7.

The intelligent control unit 7 further includes a power supply 72 (U2), a communication module 73 (U3), an intelligent control unit protection circuit 74 (U4), a display, output and operation 75 (U5), and a data storage 76 (U6). The processor 71 (U1) contains a quartz oscillator and a filter circuit. The intelligent control unit protection circuit 74 (U4) includes a surge protection circuit, the filter circuit, a short-circuit protection circuit, a polarity protection circuit, an over-voltage protection circuit, etc. The power supply has two electrodes, and further includes a step-down module. In the communication module 73 (U3), the communication chip is connected to the communication interface through the surge protection circuit.

The communication mode of the communication module 73 (U3) may be wire communication, such as an industrial control bus such as RS232, RS485, optical fiber Ethernet, 4-20 mA, Hart, IIC, SPI, Wire, a coaxial cable, a PLC power carrier, etc.; or wireless communication: such as 2G/3G/4G/5G, etc., WIFI, Bluetooth, Lora, Lorawan, Zigbee, infrared ray, ultrasonic wave, sound wave, satellite, optical wave, quantum communication, sonar, etc. The display and output 75 (U5) may be a digital tube, an LED, an LCD, an HMI, a display, a matrix screen, a printer, a fax, a projector, the mobile phone, etc. and may be flexibly combined by one or more thereof. The data storage 76 (U6) may be a FLASH, a RAM, a ROM, a hard disk, an SD flashcard, a magnetic tape, a punched tape, an optical disc, a USB disk, a disc, a film, etc, and may be flexibly combined by one or more thereof.

Embodiment VIII

Figure 8:
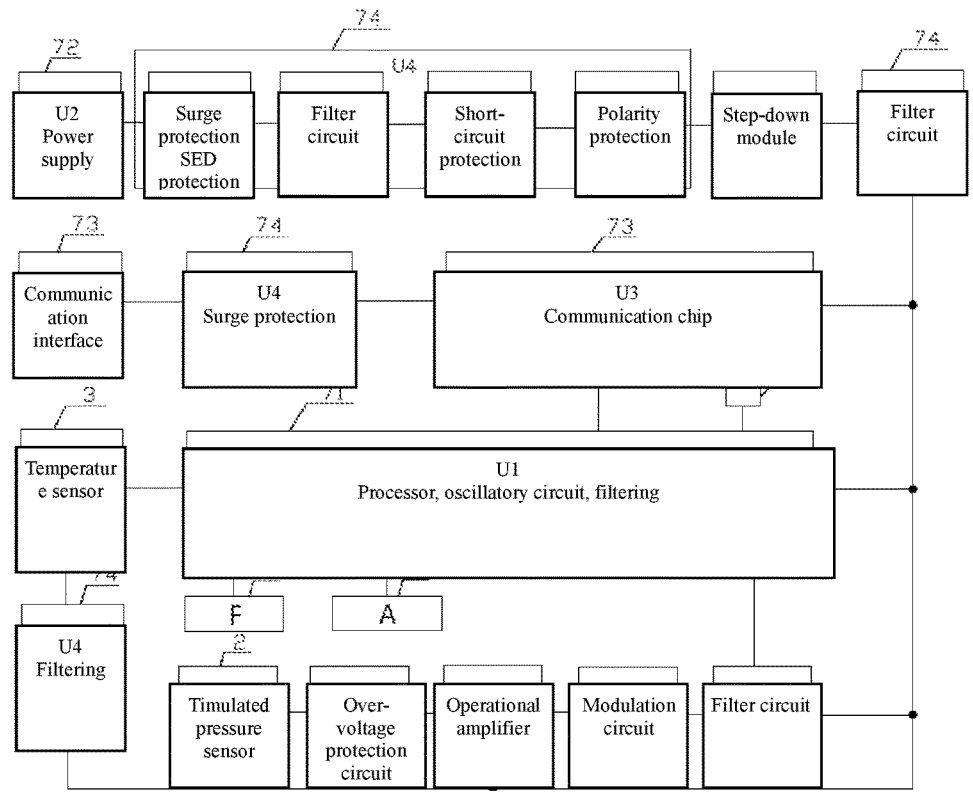
FIG. 8 is a schematic diagram of a control circuit of a field detection device of Embodiment VIII.

As shown in FIG. 8, the embodiment differs from embodiment VII in that: the intelligent control unit 7 includes the processor 71 (U1), the power supply 72 (U2), the communication module 73 (U3), and the intelligent control unit protection circuit 74 (U4). The pressure sensor 2 passes through the over-voltage protection circuit, an operational amplifier circuit, a modulation circuit and then the filter circuit to the processor 71 (U1).

Embodiment IX

Figure 9:
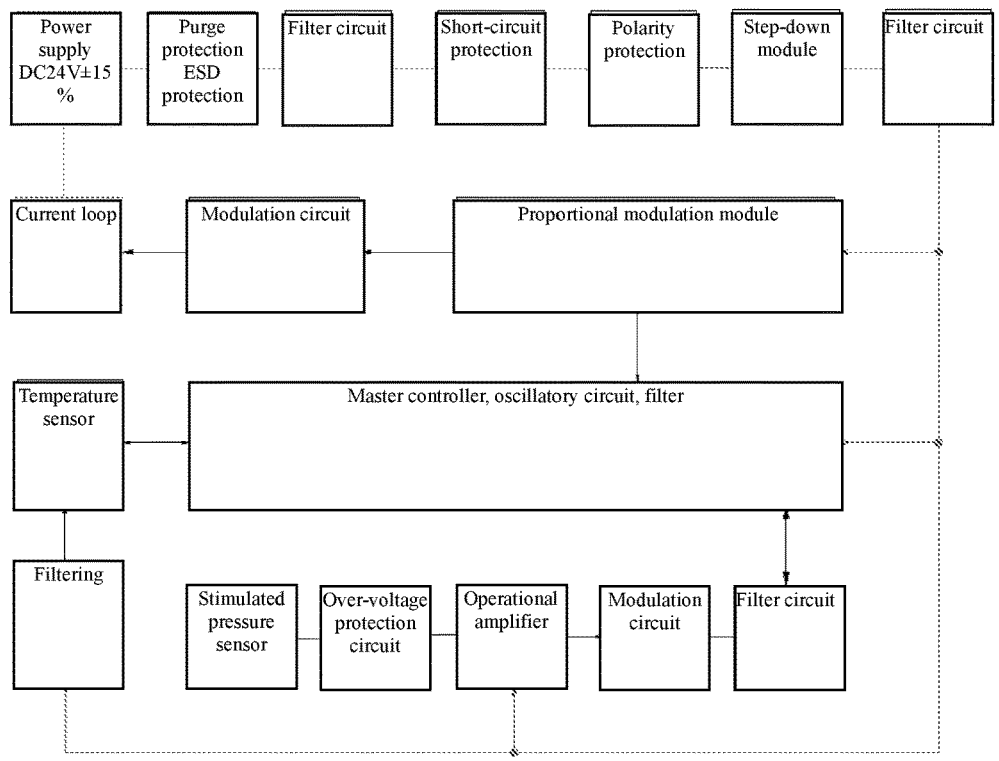
FIG. 9 is a schematic diagram of a control circuit of a 4-20 mA type density transmitter of a field detection device of Embodiment IX.

FIG. 9 is a schematic diagram of a circuit of a 4-20 mA type density transmitter of a field detection device. As shown in FIG. 9, the 4-20 Ma type density transmitter mainly consists of a microprocessor (including a main controller, a quartz oscillator and a filter circuit), a power supply, a modulation circuit, a current loop, a protection circuit, a pressure sensor, an operational amplifier, a temperature sensor, a proportional modulation module, a step-down module, etc. The microprocessor contains the quartz oscillator and the filter circuit. The protection circuit includes the surge protection circuit, the filter circuit, the short-circuit protection circuit, the polarity protection circuit, the over-voltage protection circuit, etc. An analog pressure sensor passes through the over-voltage protection circuit, the operational amplifier circuit, to the modulation circuit, and then passes through the filter circuit to the microprocessor, so that the microprocessor is able to collect the pressure value and the temperature value, after calculation and conversion by the microprocessor, the density value signal may be obtained. The density value signal passes through the proportional modulation module, the modulation circuit and the current loop to obtain a density value of 4-20 Ma.

To sum up, after the analog pressure sensor, the temperature sensor and a micro-water sensor pass through the amplifier circuit, going to an A/D conversion and then to a MCU to realize the collection of the pressure, the temperature, and the water. The intelligent control unit 7 may contain or be connected to the printer and a liquid crystal display, and may also achieve USB storage and RS232 communication.

Embodiment X

Figure 10:
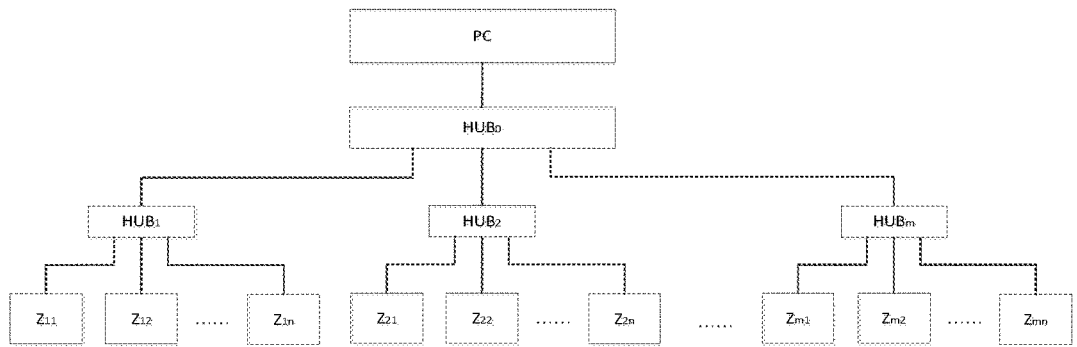
FIG. 10 is a architectural schematic diagram of a field detection system of Embodiment X.

FIG. 10 is an architectural schematic diagram of a field detection system. As shown in FIG. 10, a plurality of high-voltage electrical equipments with an SF6 gas chamber arranged, and a plurality of the field detection devices are sequentially connected to a remote background detection system through an HUB and a protocol converter. Each field detection device is respectively arranged on the corresponding high-voltage electrical equipment of the SF6 gas chamber.

In this embodiment, the remote background detection system PC communicates with a plurality of HUBs (HUB1, HUB2, . . . HUBm) through a HUB0. Each HUB is connected to a group of field detection devices Z, for example, HUB1 is connected to the field detection devices Z11, Z12, . . . , Z1n, HUB2 is connected to the field detection devices Z21, Z22, Z2n, . . . , and HUBm is connected to the field detection devices Zm1, Zm2, . . . , Zmn, where m and n are natural numbers.

The remote background detection system includes: 1) a background software platform: based on Windows, Linux and others, or VxWorks, Android, Unix, UCos, FreeRTOS, RTX, embOS and MacOS. 2) key business modules of the background software: for example, rights management, device management, data storage and queries, etc. and user management, alarm management, real-time data, historical data, real-time curves, historical curves, configuration management, data collection, data parsing, recording conditions, exception handling, etc. 3) interface configuration: for example, Form interface, Web interface, configuration interface, etc.

Embodiment XI

Figure 11:
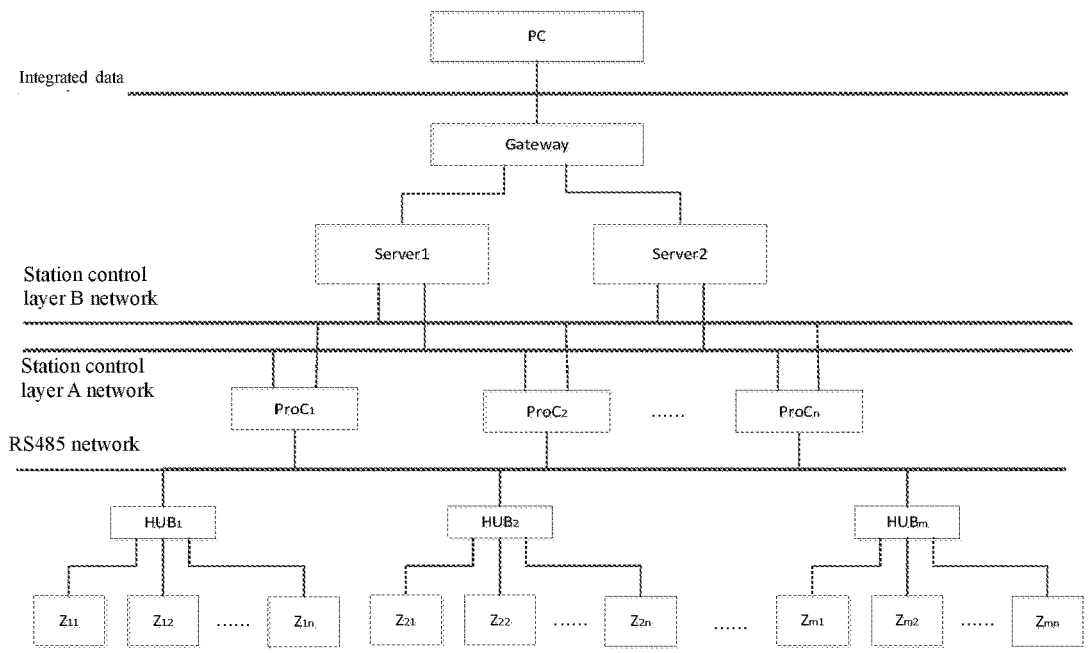
FIG. 11 is an architectural schematic diagram of a field detection system of Embodiment XI.

FIG. 11 is an architectural schematic diagram of another field detection system. Compared with Embodiment X, the embodiment adds a network switch Gateway, an integrated application Server and a protocol converter/online monitoring intelligent unit ProC. In the embodiment the remote background detection system PC is connected to two integrated application servers (Server 1 and Server 2) through the network switch Gateway; the two integrated application servers (Server 1 and Server 2) communicate with a plurality of protocol converters/online monitoring intelligent units ProC (ProC1, ProC2, . . . , ProCn) through a station control layer A network and a station control layer B network; and the protocol converters/online monitoring intelligent units ProC communicate with a plurality of hubs HUB (HUB1, HUB2, . . . , HUBm) through an R5485 network. Each HUB is connected to a group of field detection devices Z, for example, HUB1 is connected to the field detection devices Z11, Z12, . . . , Z1n, HUB2 is connected to the field detection devices Z21, Z22, Z2n, . . . , and HUBm is connected to the field detection devices Zm1, Zm2, . . . , Zmn, where m and n are natural numbers.

Embodiment XII

Figure 12:
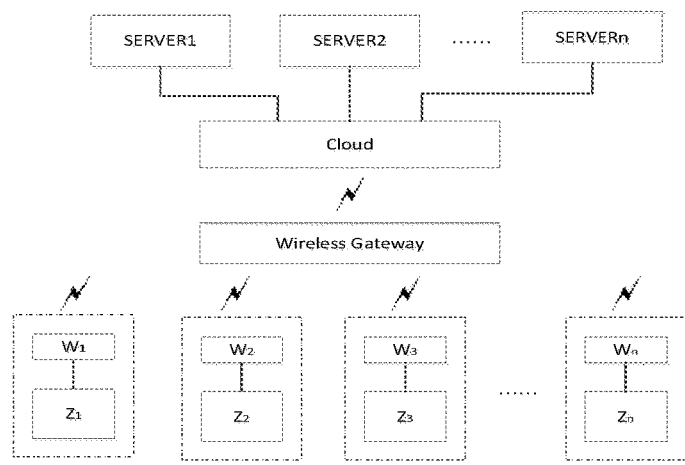
FIG. 12 is an architectural schematic diagram of a field detection system of Embodiment XII.

FIG. 12 is an architectural schematic diagram of another field detection system. The embodiment is an architectural schematic diagram of a wireless transmission mode, dashed boxes in the figure indicate that the wireless module Wn and the field detection device Zn may be integrated or separated, and the specific scheme may be flexible.

A plurality of integrated application servers (Server 1, server 2, . . . , Server n) perform wireless communication with each field detection device through a Cloud, a Wireless Gateway and a wireless module of each field detection device. N is a natural number.

In addition to the online check of field detection device, the system may also monitor the temperature, pressure, density, micro-water and other physical quantities and trends of the SF6 gas in the electrical equipment such as a circuit breaker and a GIS in real time. and has a communication interface to upload the data to the remote background detection system, so as to realize the online monitoring function of the SF6 gas density, micro-water and other physical quantities in the electrical equipment such as the circuit breaker and the GIS and may flexibly set an alarm limit, query historical data in place, accurately analyze and determine leakage trend and leakage rate of the equipment, and discover the abnormality of the equipment in advance, thereby ensuring the safe operation of the electrical equipment and the substation system, and realizing the online monitoring of the electrical equipment in substations, especially unattended substations. Configuration Principle: the system should be built with a layered distributed bus structure to meet the requirements of the three-layer structure of the intelligent substation: a process layer (sensor layer, namely the field detection device), a spacer layer (data transmission, acquisition and processing layer), a station control layer (monitoring host, database server, etc.) and the overall system adopts an IEC 61850 standard power communication protocol. The remote background detection system is responsible for the collection, comprehensive analysis, fault diagnosis, storage and standardized data forwarding of the monitoring data, and has functions of real-time data display, trend analysis, historical data query and real-time alarm. By means of the system, the gas density and the micro-water of the high-voltage electrical equipment may be checked online instead of on site, the gas density relay may be checked and detected online, a solid basis may be provided for state maintenance of the SF6 electrical equipment through an expert analysis software, the requirements of power grid automation and equipment state maintenance are met, the safety operation and operation management level of the power grid system are improved, expected diagnosis and trend analysis are carried out, and the important effect of planned outage maintenance is reduced.

Under different temperatures, the check requirements may be based on national standards or industry standards, for example, according to the provisions on temperature compensation performance stipulated in Article 4.8 of DL/T 259 "Calibration Regulation for Sulfur Hexafluoride Gas Density Monitor", the accuracy requirements corresponding to each temperature value, i. e. the requirements for error determination are different, and may be based on standards or otherwise. Comparison and determination of different annual synchronous (or in-season) may carried out. For example, the check results in May 2021 may be directly compared with, performed trend analysis and determination together with the check results in May 2019 and May 2020. The check may be performed as needed, and a mobile design can also be performed, that is, after a substation A works for a period of time and completes a task, the task may be moved to the station B for working for a period of time, after the task is completed, the task is moved to the work of the C substation.

The check accuracy of the field detection device of the present application may reach a grade of 0.25 at a degree of 20, and reach a grade of 0.625 at a high temperature or a low temperature, and the check accuracy meets the requirements, and meets the requirements or relevant specifications in terms of economy and measurement.

The embodiments of the present invention have been described in detail above, but are merely embodiments, and the present invention is not limited thereto. Any equivalent modifications and substitutions made to the present invention are also within the scope of the present invention for those skilled in the art. Therefore, equivalent changes and modifications made without departing from the spirit and scope of the present invention should be included within the scope of the present invention.

What is claimed is:

1. A field detection device for achieving no maintenance of a gas density relay, the device comprising a temperature adjusting mechanism and an intelligent control unit, wherein the temperature adjusting mechanism is a temperature-adjustable adjusting mechanism provided outside or inside a housing of the detected gas density relay and configured to regulate temperature rise and fall of a temperature compensation element of the gas density relay to cause a contact action of the gas density relay; the intelligent control unit is connected to the temperature adjusting mechanism and used for receiving and/or calculating a gas density value when a contact of the gas density relay is in action;

the temperature adjusting mechanism is a heating element; or the temperature adjusting mechanism includes a heating element, a heat insulation element, a temperature controller, a temperature detector, and a temperature adjusting mechanism outer shell; or the temperature adjusting mechanism includes a heating element and a temperature controller; or the temperature adjusting mechanism includes a heating element, a heating power regulator, and a temperature controller; or the temperature adjusting mechanism includes a heating element, a refrigeration element, a heating power regulator, and a temperature controller; or the temperature adjusting mechanism includes a heating element, a heating power regulator, and a thermostatic controller; or the temperature adjusting mechanism includes a heating element, a temperature controller, and a temperature detector; or the temperature adjusting mechanism is a heating element, and the heating element is provided near the temperature compensation element; or the temperature adjusting mechanism is a miniature constant temperature box;

wherein the number of the heating element is at least one, and the heating element comprises one of a silicon rubber heater, a resistance wire, an electric heating tape, an electric heating rod, a hot gas fan, an infrared ray heating element, and a semiconductor;

the temperature controller is connected to the heating element and used for controlling a heating temperature of the heating element, and the temperature controller comprises one of a PID controller, a controller combining PID and fuzzy control, an inverter controller, and a PLC controller.

2. The field detection device for achieving no maintenance of a gas density relay according to claim 1, wherein a contact signal is generated during the contact action, wherein the contact signal comprises an alarm and/or locking.

3. The field detection device for achieving no maintenance of a gas density relay according to claim 1, wherein the intelligent control unit further comprises a communication module for implementing long-distance transmission of test data and/or check results, wherein a communication mode of the communication module is wire communication or wireless communication.

4. The field detection device for achieving no maintenance of a gas density relay according to claim 1, wherein the temperature adjusting mechanism regulates rise and fall of the temperature, wherein a rate of change of the temperature is not more than 0.5° C. per second.

5. The field detection device for achieving no maintenance of a gas density relay according to claim 1, wherein the field detection device further comprises an online check contact signal sampling unit, wherein the online check contact signal sampling unit is provided with a sampling contact connected to the gas density relay and configured to sample a contact signal of the gas density relay; and the online check contact signal sampling unit is further connected to the intelligent control unit.

6. The field detection device for achieving no maintenance of a gas density relay according to claim 5, wherein the online check contact signal sampling unit is provided with at least one independent sampling contact and capable of automatically completing a check on at least one contact of the gas density relay at the same time, and continuously measuring without replacing a contact or reselecting a contact; wherein the contact comprises any one of an alarm contact, an alarm contact+a locking contact, an alarm contact+a locking 1 contact+a locking 2 contact, and an alarm contact+a locking contact+an overpressure contact.

7. The field detection device for achieving no maintenance of a gas density relay according to claim 5, wherein the online check contact signal sampling unit comprises a first connecting circuit and a second connecting circuit, wherein the first connecting circuit connects the contact of the detected gas density relay to a contact signal control loop, and the second connecting circuit connects the contact of the detected gas density relay to the intelligent control unit;

wherein in a non-check state, the contact is a normally open density relay, the second connecting circuit is disconnected or isolated, and the first connecting circuit is closed; in a check state, the first connecting circuit is disconnected, and the second connecting circuit is connected, such that the contact of the gas density relay is connected to the intelligent control unit; or in a non-check state, the contact is a normally closed density relay, the second connecting circuit is disconnected or isolated, and the first connecting circuit is closed; in a check state, the contact signal control loop is closed, such that the contact of the gas density relay is disconnected from the contact signal control loop, and the second connecting circuit is connected, such that the contact of the gas density relay is connected to the intelligent control unit.

8. The field detection device for achieving no maintenance of a gas density relay according to claim 1, wherein the field detection device further comprises a gas density detection sensor, wherein the gas density detection sensor is provided with an interface in communication with the gas density relay; and the gas density detection sensor is further connected to the intelligent control unit and transmits a collected pressure value and temperature value, and/or gas density value to the intelligent control unit; wherein the gas density detection sensor comprises at least one pressure sensor and at least one temperature sensor, wherein the pressure sensor is mounted on a gas path of the gas density relay, and the temperature sensor is mounted on or outside the gas path of the gas density relay, or inside the gas density relay, or outside the gas density relay; or the gas density detection sensor is a gas density transmitter composed of a pressure sensor and a temperature sensor; or the gas density detection sensor is a density detection sensor using a quartz tuning fork technology.

9. The field detection device for achieving no maintenance of a gas density relay according to claim 8, wherein the intelligent control unit obtains the contact action or switching of the gas density relay, and the gas density value collected by the gas density detection sensor, such that an online check on the gas density relay is completed; or the intelligent control unit obtains the contact action or a signal of switching of the gas density relay, and the pressure value and temperature value collected by the gas density detection sensor that are converted to a pressure value corresponding to 20° C. according to the pressure-temperature characteristic of gas, i.e., a gas density value, such that an online check on the gas density relay is completed.

10. The field detection device for achieving no maintenance of a gas density relay according to claim 8, wherein the gas density detection sensor comprises at least one pressure sensor and at least one temperature sensor; pressure values collected by each pressure sensor and temperature values collected by each temperature sensor are randomly arranged and combined, each combination is converted to a plurality of pressure values corresponding to 20° C. according to the pressure-temperature characteristic of gas, i.e., gas density values, and a comparison is made among each gas density value to complete a mutual check on each pressure sensor and each temperature sensor; or pressure values collected by each pressure sensor and temperature values collected by each temperature sensor traverse all arrangements and combinations, each combination is converted to a plurality of pressure values corresponding to 20° C. according to the pressure-temperature characteristic of gas, i.e., gas density values, and a comparison is made among each gas density value to complete a mutual check on each pressure sensor and each temperature sensor; or a plurality of gas density values obtained by each pressure sensor and each temperature sensor are compared with a compared density value output signal output by the gas density relay to complete a mutual check on each pressure sensor and each temperature sensor; or comparisons are made among a plurality of gas density values, pressure values, and temperature values obtained by each pressure sensor and each temperature sensor to complete mutual checks on the gas density relay, each pressure sensor, and each temperature sensor.

11. The field detection device for achieving no maintenance of a gas density relay according to claim 1, wherein the field detection device further comprises a valve, wherein one end of the valve is provided with a connection port in communication with an electrical equipment, and the other end of the valve is in communication with a gas path of the gas density relay; the valve is further connected to the intelligent control unit; the valve is configured to regulate gas pressure rise and fall of the gas density relay, or is used to set a gas initial pressure during a check, and then cooperate and/or combine with the temperature adjusting mechanism, to cause the contact action of the gas density relay.

12. The field detection device for achieving no maintenance of a gas density relay according to claim 1 or 11, the device further comprising a pressure adjusting mechanism, wherein a gas path of the pressure adjusting mechanism is in communication with the gas density relay; the pressure adjusting mechanism is further connected to the intelligent control unit, regulates gas pressure rise and fall of the gas density relay under the control of the intelligent control unit, and then cooperates and/or combines with the temperature adjusting mechanism, to cause the contact action of the gas density relay; or
further includes a heating member, where the intelligent control unit is connected to the heating member; or
further includes an air chamber and a heating member, where the air chamber is in communication with the gas density relay, the heating member is provided outside or inside the air chamber, and the intelligent control unit is connected to the heating member.

13. A field detection method for achieving no maintenance of a gas density relay, the method comprising a field detection device, wherein the field detection device comprises a temperature adjusting mechanism and an intelligent control unit, and the field detection device further comprises an online check contact signal sampling unit, wherein the online check contact signal sampling unit is connected to the intelligent control unit, and the online check contact signal sampling unit is configured to, in a gas density relay check state, cut off a contact signal control loop of the gas density relay, connect a contact of the gas density relay to the intelligent control unit, sample a contact signal of the gas density relay, and transmit the contact signal to the intelligent control unit; and the field detection method comprising:
arranging the temperature adjusting mechanism of the field detection device together with the detected gas density relay, and connecting the intelligent control unit of the field detection device to the gas density relay;
monitoring, by the gas density relay in a normal operating state, a gas density value in an electrical equipment;
the field detection device, according to a set check time and/or check instruction, and a gas density value status and/or temperature value status, and under the condition that the gas density relay is allowed to and/or can be checked:
increasing the temperature of the gas density relay through the control of the intelligent control unit over the temperature adjusting mechanism, and then the temperature of a temperature compensation element of the gas density relay increasing, such that the gas density relay having a contact action, where the contact action is transmitted to the intelligent control unit through the online check contact signal sampling unit, and the intelligent control unit obtains a gas density value according to a pressure value and temperature value during the contact action, or directly obtains a gas density value, detects a contact signal action value of the gas density relay, and completes a check on the contact signal action value of the gas density relay;
turning off, by the intelligent control unit, a heating element of the temperature adjusting mechanism after all the check on the contact signal is completed.

14. The field detection method for achieving no maintenance of a gas density relay according to claim 13, wherein after the field detection device completes the check on the contact action value of the gas density relay, the temperature of the gas density relay is reduced through the control of the intelligent control unit over the temperature adjusting mechanism, and then the temperature of the temperature compensation element of the gas density relay decreases, such that the gas density relay has a contact reset, wherein the contact reset is transmitted to the intelligent control unit through the online check contact signal sampling unit, and the intelligent control unit obtains a gas density value according to a pressure value and temperature value during the contact reset, or directly obtains a gas density value, detects a contact signal return value of the gas density relay, and completes a check on the contact signal return value of the gas density relay.

15. The field detection method for achieving no maintenance of a gas density relay according to claim 13, wherein the field detection device further comprises a valve and a pressure adjusting mechanism, wherein one end of the valve is provided with a connection port in communication with an electrical equipment, the other end of the valve is in communication with a gas path of the gas density relay, a gas path of the pressure adjusting mechanism is in communication with the gas density relay, and the valve and the pressure adjusting mechanism are further connected to the intelligent control unit; wherein the field detection method further comprises:

monitoring, by the gas density relay in a normal operating state, a gas density value in an electrical equipment;

the intelligent control unit or the gas density relay, according to the set check time and/or check instruction, and the gas density value status and/or temperature value status, and under the condition that the gas density relay is allowed to and/or can be checked:

closing the valve through the intelligent control unit;

driving the pressure adjusting mechanism through the intelligent control unit to make the gas pressure slowly decrease, and increasing the temperature of the gas density relay through the control of the intelligent control unit over the temperature adjusting mechanism, and then the temperature of the temperature compensation element of the gas density relay increasing, such that the gas density relay having a contact action, where the contact action is transmitted to the intelligent control unit through the online check contact signal sampling unit, and the intelligent control unit obtains a gas density value according to a pressure value and temperature value during the contact action, or directly obtains a gas density value, detects a contact signal action value of the gas density relay, and completes a check on the contact signal action value of the gas density relay;

opening the valve by the intelligent control unit, and turning off, by the intelligent control unit, the heating element of the temperature adjusting mechanism after all the check on the contact signal is completed.

16. The field detection method for achieving no maintenance of a gas density relay according to claim 13, wherein the field detection device further comprises a valve and a pressure adjusting mechanism, wherein one end of the valve is provided with a connection port in communication with an electrical equipment, the other end of the valve is in communication with a gas path of the gas density relay, a gas path of the pressure adjusting mechanism is in communication with the gas density relay, and the valve and the pressure adjusting mechanism are further connected to the intelligent control unit; wherein the field detection method further comprises:

monitoring, by the gas density relay in a normal operating state, a gas density value in the electrical equipment, and monitoring online, by the gas density relay through a gas density detection sensor and the intelligent control unit, a gas density value in the electrical equipment;

the intelligent control unit or the gas density relay, according to the set check time and/or check instruction, and the gas density value status and/or temperature value status, and under the condition that the gas density relay is allowed to and/or can be checked:

closing the valve through the intelligent control unit;

adjusting the online check contact signal sampling unit to a check state through the intelligent control unit, wherein in the check state, the online check contact signal sampling unit cuts off a control loop of the contact signal of the gas density relay to connect the contact of the gas density relay to the intelligent control unit;

increasing the temperature of the gas density relay through the control of the intelligent control unit over the temperature adjusting mechanism, and then the temperature of the temperature compensation element of the gas density relay increasing, and driving the pressure adjusting mechanism through the intelligent control unit to make the gas pressure slowly decrease, such that the gas density relay having a contact action, where the contact action is transmitted to the intelligent control unit through the online check contact signal sampling unit, and the intelligent control unit obtains a gas density value according to a pressure value and temperature value during the contact action, or directly obtains a gas density value, detects a contact signal action value of the gas density relay, and completes a check on the contact signal action value of the gas density relay;

reducing the temperature of the gas density relay through the control of the intelligent control unit over the temperature adjusting mechanism, and then the temperature of a temperature compensation element of the gas density relay decreasing, and driving the pressure adjusting mechanism through the intelligent control unit to make the gas pressure slowly increase, such that the gas density relay having a contact reset, where the contact reset is transmitted to the intelligent control unit through the online check contact signal sampling unit, and the intelligent control unit obtains a gas density value according to a pressure value and temperature value during the contact reset, or directly obtains a gas density value, detects a contact signal return value of the gas density relay, and completes a check on the contact signal return value of the gas density relay;

opening the valve by the intelligent control unit, turning off, by the intelligent control unit, the heating element of the temperature adjusting mechanism, and adjusting, by the intelligent control unit, the online check contact signal sampling unit to an operating state, and the control loop of the contact signal of the gas density relay resuming a normal operating state, after all the check on the contact signal is completed.

17. The field detection method for achieving no maintenance of a gas density relay according to claim 13, wherein the field detection device further comprises a valve, wherein one end of the valve is provided with a connection port in communication with an electrical equipment, the other end of the valve is in communication with a gas path of the gas density relay, and the valve is further connected to the intelligent control unit; wherein the field detection method further comprises:

monitoring, by the gas density relay in a normal operating state, a gas density value in the electrical equipment, and monitoring online, by the gas density relay through a gas density detection sensor and the intelligent control unit, a gas density value in the electrical equipment;

the intelligent control unit or the gas density relay, according to the set check time and/or check instruction, and the gas density value status and/or temperature value status, and under the condition that the gas density relay is allowed to and/or can be checked:

adjusting the contact signal sampling unit to a check state through the intelligent control unit, wherein in the check state, the contact signal sampling unit cuts off a control loop of the contact signal of the gas density relay to connect the contact of the gas density relay to the intelligent control unit;

Increasing the temperature of gas of the gas density relay through the control of the intelligent control unit over the temperature adjusting mechanism, and closing the valve through the intelligent control unit after the temperature reaching a set value;

after the temperature or pressure of the gas of the gas density relay decreases to a set value, increasing the temperature of the gas density relay through the control of the intelligent control unit over the temperature adjusting mechanism, and then the temperature of a temperature compensation element of the gas density relay increasing, such that the gas density relay having a contact action, wherein the contact action is transmitted to the intelligent control unit through the contact signal sampling unit, and the intelligent control unit obtains a gas density value according to a pressure value and temperature value during the contact action, or directly obtains a gas density value, detects a contact signal action value of the gas density relay, and completes a check on the contact signal action value of the gas density relay;

opening the valve by the intelligent control unit, and turning off, by the intelligent control unit, the temperature adjusting mechanism after all the check on the contact signal is completed.

18. The field detection method for achieving no maintenance of a gas density relay according to claim 13, wherein the field detection device further comprises a heating member, an air chamber, and a valve, wherein the air chamber is in communication with the gas density relay, the heating member is provided outside or inside the air chamber, one end of the valve is provided with a connection port in communication with an electrical equipment, and the other end of the valve is in communication with a gas path of the gas density relay; wherein the field detection method further comprises:

monitoring, by the gas density relay in a normal operating state, a gas density value in the electrical equipment, and monitoring online, by the gas density relay through a gas density detection sensor and the intelligent control unit, a gas density value in the electrical equipment;

the intelligent control unit or the gas density relay, according to the set check time and/or check instruction, and the gas density value status and/or temperature value status, and under the condition that the gas density relay is allowed to and/or can be checked:

adjusting the contact signal sampling unit to a check state through the intelligent control unit, wherein in the check state, the contact signal sampling unit cuts off a control loop of the contact signal of the gas density relay to connect the contact of the gas density relay to the intelligent control unit;

controlling the heating member to heat through the intelligent control unit to cause a change in the temperature of gas in the air chamber, and after the temperature reaching a set value, closing the valve through the intelligent control unit and turning off the heating member through the intelligent control unit;

after the temperature or pressure of the air chamber decreases to a set value, increasing the temperature of the gas density relay through the control of the intelligent control unit over the temperature adjusting mechanism, and then the temperature of a temperature compensation element of the gas density relay increasing, such that the gas density relay having a contact action, wherein the contact action is transmitted to the intelligent control unit through the contact signal sampling unit, and the intelligent control unit obtains a gas density value according to a pressure value and temperature value during the contact action, or directly obtains a gas density value, detects a contact signal action value of the gas density relay, and completes a check on the contact signal action value of the gas density relay;

opening the valve by the intelligent control unit, and turning off, by the intelligent control unit, the temperature adjusting mechanism after all the check on the contact signal is completed.

19. The field detection method for achieving no maintenance of a gas density relay according to claim 17, wherein the method comprises:

after the check on the contact signal action value of the gas density relay is completed, reducing the temperature of the gas density relay through the control of the intelligent control unit over the temperature adjusting mechanism, and then the temperature of the temperature compensation element of the gas density relay decreasing, such that the gas density relay having a contact reset, wherein the contact reset is transmitted to the intelligent control unit through the contact signal sampling unit, and the intelligent control unit obtains a gas density value according to a pressure value and temperature value during the contact reset, or directly obtains a gas density value, detects a contact signal return value of the gas density relay, and completes a check on the contact signal return value of the gas density relay;

opening the valve by the intelligent control unit, turning off, by the intelligent control unit, the temperature adjusting mechanism, and adjusting, by the intelligent control unit, the contact signal sampling unit to an operating state, and the control loop of the contact signal of the gas density relay resuming a normal operating state, after all the check on the contact signal is completed.

\* \* \* \* \*